United States Patent
Endo et al.

(10) Patent No.: US 12,465,955 B2
(45) Date of Patent: Nov. 11, 2025

(54) SUBSTRATE TREATMENT METHOD AND SUBSTRATE TREATMENT DEVICE

(71) Applicant: SCREEN Holdings Co., Ltd., Kyoto (JP)

(72) Inventors: Toru Endo, Kyoto (JP); Hideji Naohara, Kyoto (JP); Yuji Okita, Kyoto (JP); Katsuei Higashi, Kyoto (JP); Takahiro Yamaguchi, Kyoto (JP); Ryuta Tsukahara, Kyoto (JP); Akira Ishimaru, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 251 days.

(21) Appl. No.: 18/254,830

(22) PCT Filed: Oct. 29, 2021

(86) PCT No.: PCT/JP2021/039949
§ 371 (c)(1),
(2) Date: May 26, 2023

(87) PCT Pub. No.: WO2022/113641
PCT Pub. Date: Jun. 2, 2022

(65) Prior Publication Data
US 2024/0001411 A1    Jan. 4, 2024

(30) Foreign Application Priority Data
Nov. 30, 2020 (JP) .................. 2020-197918

(51) Int. Cl.
*B08B 3/08* (2006.01)
*B08B 3/10* (2006.01)

(52) U.S. Cl.
CPC . *B08B 3/08* (2013.01); *B08B 3/10* (2013.01)

(58) Field of Classification Search
None
See application file for complete search history.

(56) References Cited

U.S. PATENT DOCUMENTS

| 2010/0078423 A1 | 4/2010 | Sato et al. ............. 219/439 |
| 2019/0096720 A1 | 3/2019 | Naohara et al. |

(Continued)

FOREIGN PATENT DOCUMENTS

| JP | 201917787 A | 5/2019 |
| JP | 2019-169648 A | 10/2019 |

(Continued)

OTHER PUBLICATIONS

International Search Report mailed Feb. 1, 2022 in corresponding PCT International Application No. PCT/JP2021/039949, 4 Pages.

(Continued)

*Primary Examiner* — Kaj K Olsen
*Assistant Examiner* — Arlyn I Rivera-Cordero
(74) *Attorney, Agent, or Firm* — OSTROLENK FABER LLP

(57) ABSTRACT

A substrate processing method includes a substrate holding step of holding a substrate at a holding position surrounded by a cylindrical guard, a processing liquid supplying step of supplying a processed surface of the substrate with a processing liquid with which the processed surface of the substrate is processed while rotating the substrate held at the holding position about a rotation axis passing through a central portion of the substrate, an image acquiring step of acquiring an image of the processed surface of the substrate and an image of an inner wall surface of the guard while supplying the processing liquid to the processed surface of the substrate, and a detecting step of monitoring luminance values of the images obtained in the image acquiring step, and detecting a processing end time point at which process- (Continued)

ing of the processed surface of the substrate with the processing liquid is ended.

16 Claims, 14 Drawing Sheets

(56) References Cited

U.S. PATENT DOCUMENTS

2019/0295862 A1 9/2019 Endo et al.
2020/0227285 A1 7/2020 Iwao et al.

FOREIGN PATENT DOCUMENTS

JP 2020-107779 A 7/2020
KR 10-2010-0036181 A 4/2010

OTHER PUBLICATIONS

Written Opinion mailed Feb. 1, 2022 in corresponding PCT International Application No. PCT/JP2021/039949, 5 Pages.
International Preliminary Report on Patentability (Chapter I) mailed Jun. 15, 2023 with a copy of Notification from the International Bureau (Form PCT/IB/326) for corresponding International Application No. PCT/JP2021/039949 in Japanese, 3 Pages.
English translation of the International Preliminary Report on Patentability (Chapter I) mailed Jun. 15, 2023 with a copy of Notification from the International Bureau (Form PCT/IB/338) for corresponding International Application No. PCT/JP2021/039949, 4 Pages.

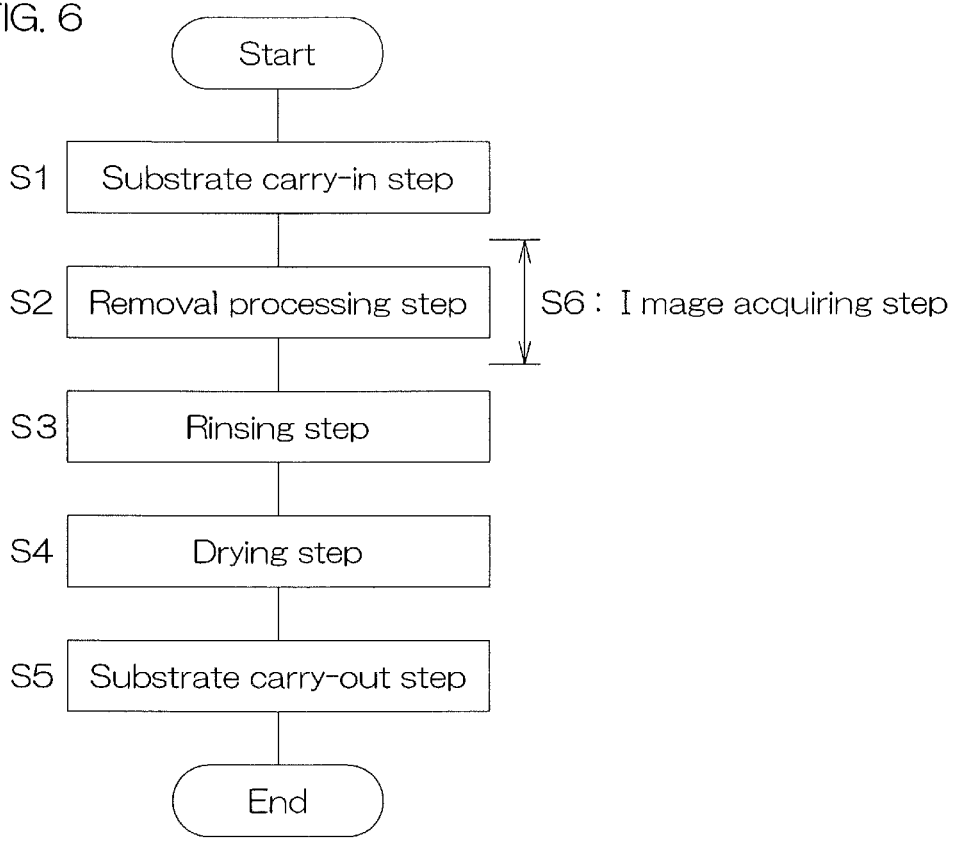

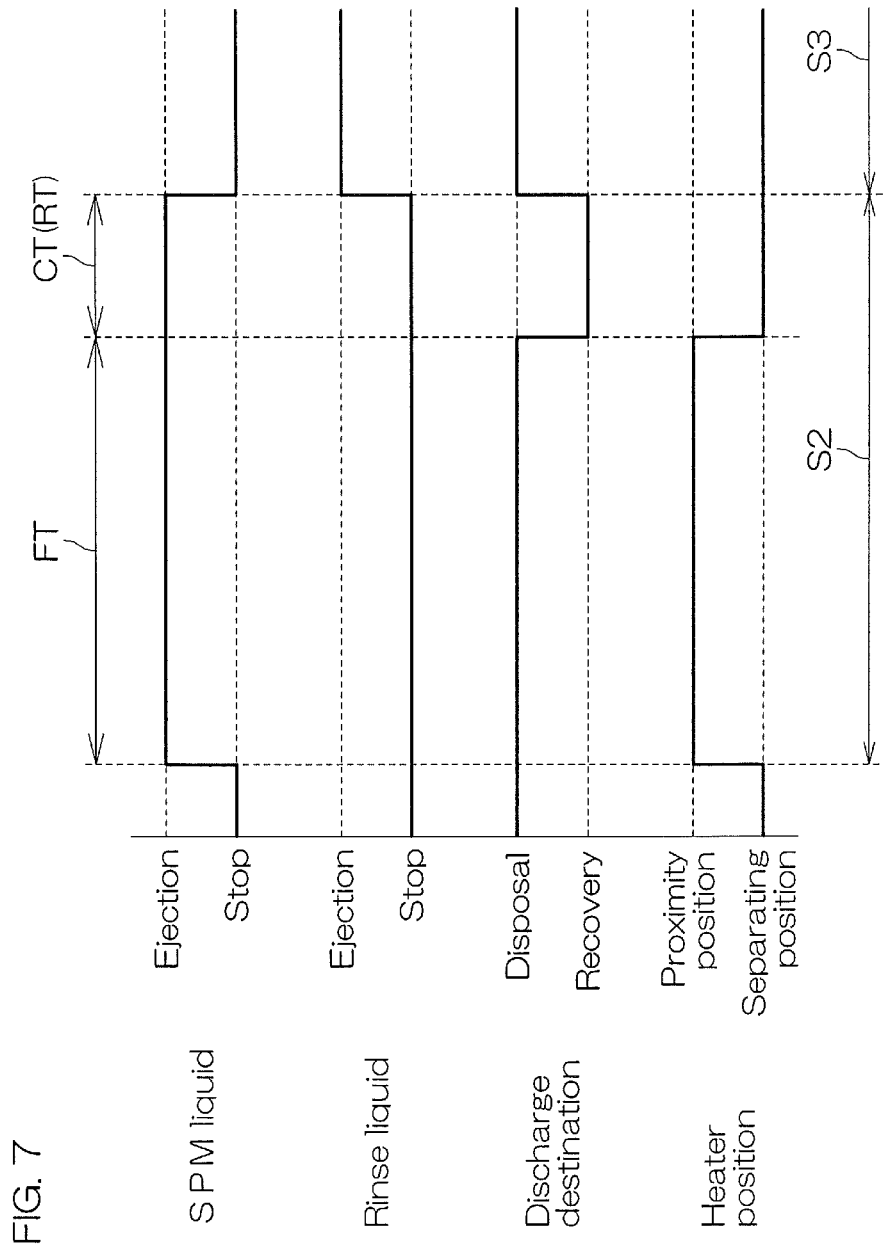

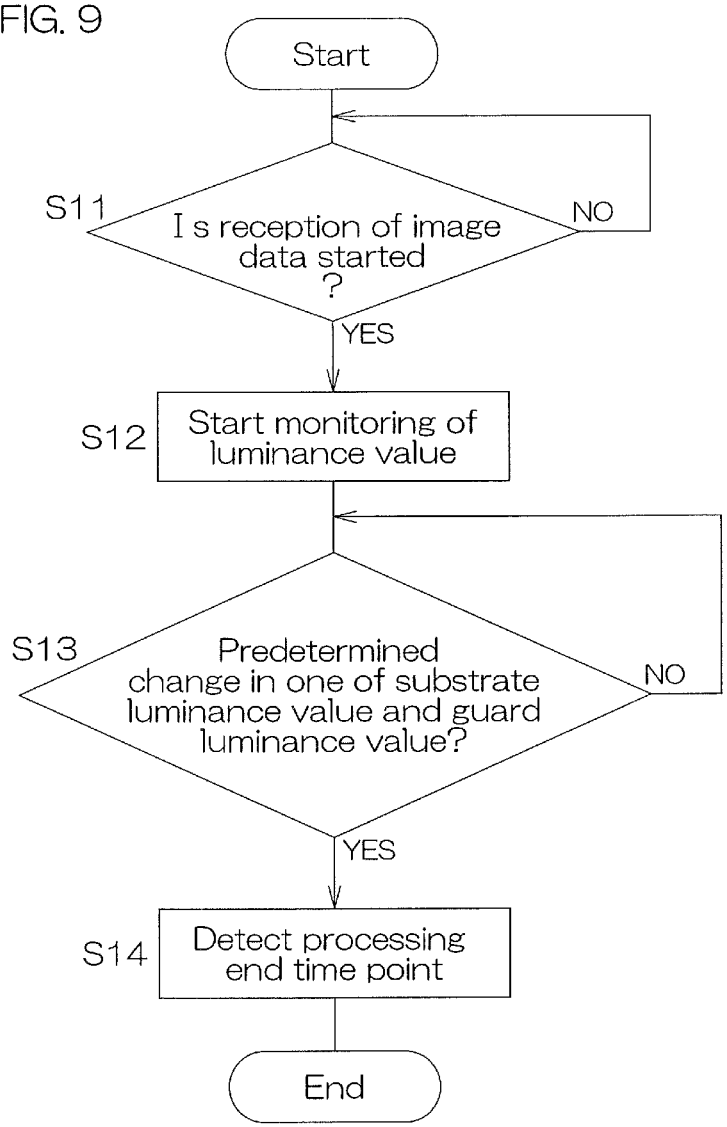

SUBSTRATE TREATMENT METHOD AND SUBSTRATE TREATMENT DEVICE

CROSS-REFERENCE TO RELATED APPLICATIONS

The present application is a 35 U.S.C. §§ 371 national stage application of International Application No. PCT/JP2021/039949 filed Oct. 29, 2021, which claims priority to Japanese Patent Application No. 2020-197918, filed Nov. 30, 2020, the contents of which are incorporated herein by reference.

TECHNICAL FIELD

The present invention relates to a substrate processing method that processes a substrate and a substrate processing apparatus that processes a substrate. Examples of substrates to be processed include a semiconductor wafer, a substrate for a flat panel display (FPD) such as a liquid crystal display and an organic electroluminescence (EL) display, a substrate for an optical disc, a substrate for a magnetic disk, a substrate for a magneto-optical disc, a substrate for a photomask, a ceramic substrate, a substrate for a solar cell, and the like.

BACKGROUND ART

From the perspective of environmental load, it is demanded to reduce the amount of a chemical liquid to be used at the time of removing a resist from a substrate. Therefore, a technique for reducing the amount of the chemical liquid used has been proposed.

Patent Literature 1 described below discloses a technique of detecting a processing end time point based on a luminance value of an image acquired by taking an image of a surface of a substrate to be processed, and stopping supply of a chemical liquid to the surface of the substrate to be processed at a time point at which the processing end time point is detected.

Patent Literature 2 described below discloses a technique of acquiring an image of an inner wall of a first guard that receives a chemical liquid discharged from a substrate, and in accordance with a change in a color of the chemical liquid in the image, switching a discharge destination of the chemical liquid discharged from the substrate from a discharge piping to a recovery piping.

CITATION LIST

Patent Literature

Patent Literature 1: United States Patent Application Publication No. 2019/096720 Specification
Patent Literature 2: United States Patent Application Publication No. 2019/295862 Specification

SUMMARY OF INVENTION

Technical Problem

There is a case where a change in a luminance value of the surface of the substrate to be processed due to removal of a resist is small and it is difficult to detect a processing end time point from an image of the surface of the substrate to be processed depending on a type of the resist applied to a surface of a substrate to be processed. On the other hand, there is also a case where a change in a luminance value of an inner wall surface of a guard due to removal of the resist is small and it is difficult to detect a processing end time point from an image of the inner wall surface of the guard.

Thus, an object of the invention is to provide a substrate processing method and a substrate processing apparatus capable of favorably detecting an end of processing of a surface of a substrate to be processed with a processing liquid.

Solution to Problem

A preferred embodiment of the invention provides a substrate processing method including a substrate holding step of holding a substrate at a holding position surrounded by a cylindrical guard, a processing liquid supplying a surface of the substrate to be processed with a processing liquid that process the surface of the substrate to be processed while rotating the substrate held at the holding position about a rotation axis passing through a central portion of the substrate, an image acquiring step of acquiring an image of the surface of the substrate to be processed and an image of an inner wall surface of the guard while supplying the processing liquid to the surface of the substrate to be processed, and a detecting step of monitoring luminance values of the images obtained in the image acquiring step, and detecting a processing end time point at which processing of the surface of the substrate to be processed with the processing liquid is ended.

According to the substrate processing method, the processing liquid supplied to the surface of the substrate to be processed is received by the cylindrical guard that surrounds the substrate. While the processing liquid is supplied to the surface of the substrate to be processed, the images of both the surface to be processed and the inner wall surface of the guard are acquired, and the luminance values of the acquired images are monitored. Therefore, it is possible to detect the processing end time point based on both the luminance value of the image of the surface of the substrate to be processed (hereinafter, sometimes referred to as "substrate luminance value"), and the luminance value of the image of the inner wall surface of the guard (hereinafter, sometimes referred to as "guard luminance value"). Thus, in comparison to an arrangement in which only one of the substrate luminance value and the guard luminance value is monitored, it is possible to favorably detect an end of processing of the surface of the substrate to be processed.

In the preferred embodiment of the invention, the detecting step includes a step of detecting, as the processing end time point, a time point at which a predetermined change occurs in any one of the luminance value of the image of the surface of the substrate to be processed obtained in the image acquiring step and the luminance value of the image of the inner wall surface of the guard obtained in the image acquiring step. Therefore, even in a case where a change in the image luminance value or the guard luminance value when the processing of the surface of the substrate to be processed is ended is not sufficient, it is possible to promptly detect the end of the processing of the surface of the substrate to be processed.

In the preferred embodiment of the invention, the detecting step includes a step of detecting, as the processing end time point, a time point at which, after a predetermined change occurs in one of the luminance value of the image of the surface of the substrate to be processed obtained in the image acquiring step and the luminance value of the image of the inner wall surface of the guard obtained in the image acquiring step, the predetermined change occurs in the other one of the luminance value of the surface of the substrate to be processed obtained in the image acquiring step and the luminance value of the image of the inner wall surface of the guard obtained in the image acquiring step, or a time point at which a predetermined backup time elapses after the time point at which the predetermined change occurs in one of the luminance value of the image of the surface of the substrate to be processed obtained in the image acquiring step and the luminance value of the image of the inner wall surface of the guard obtained in the image acquiring step, whichever is earlier.

Even in a case where the processing of the surface of the substrate to be processed sufficiently progresses and the predetermined change occurs in the substrate luminance value, there is sometimes a case where a residue generated by the processing of the surface of the substrate to be processed adheres to the inner wall surface of the guard and there is a need for continuing supply of the processing liquid to remove the residue from the inner wall surface of the guard. On the other hand, there is sometimes a case where the processing of the entire surface of the substrate to be processed has not ended yet but due to a progress of processing of a part of the surface of the substrate to be processed, the predetermined change occurs in the guard luminance value.

Even in cases like these, when the time point at which, after the predetermined change occurs in one of the substrate luminance value and the guard luminance value, the predetermined change occurs in the other one of the substrate luminance value and the guard luminance value, or the time point at which the predetermined backup time elapses after the time point at which the predetermined change occurs in one of the substrate luminance value and the guard luminance value, whichever is earlier, is detected as the processing end time point, it is possible to promptly detect a time point at which the processing of the surface of the substrate to be processed sufficiently progresses and the residue adhering to the inner wall surface of the guard is sufficiently removed. As a result, it is possible to favorably detect the end of the processing of the surface of the substrate to be processed.

In the preferred embodiment of the invention, the substrate processing method further includes a heating step of heating the processing liquid on the surface of the substrate to be processed, a heating weakening step of weakening heating applied to the processing liquid on the surface of the substrate to be processed while maintaining supply of the processing liquid to the surface of the substrate to be processed in a case where the processing end time point is detected, and a rinse supplying step of stopping the supply of the processing liquid to the surface of the substrate to be processed after the heating weakening step, and supplying to the surface of the substrate to be processed a rinse liquid that washes away the processing liquid on the surface of the substrate to be processed.

According to the substrate processing method, the rinse liquid is not supplied to the surface of the substrate to be processed at the same time as the end of the processing of the surface of the substrate to be processed but the rinse liquid is supplied to the surface of the substrate to be processed after heating applied to the substrate is weakened. That is, the rinse liquid is supplied to the surface of the substrate to be processed after a temperature of the substrate is lowered by weakening the heating applied to the substrate. Therefore, it is possible to ease a sudden decrease in the substrate temperature (heat shock) due to supply of the rinse liquid to the substrate. While favorably detecting the end of the processing of the surface of the substrate to be processed with the processing liquid, it is possible to smoothly wash away the processing liquid with the rinse liquid.

In the preferred embodiment of the invention, the substrate processing method further includes a draining step of discharging the processing liquid scattered from the substrate to a drain flow passage, and a flow passage switching step of switching a discharge destination of the processing liquid scattered from the substrate from the drain flow passage to a recovery flow passage in a case where the processing end time point is detected.

Therefore, it is possible to switch the discharge destination of the processing liquid to the recovery flow passage at an appropriate time point at which the processing of the surface of the substrate to be processed is ended. Thus, while favorably detecting the end of the processing of the surface of the substrate to be processed, it is possible to recover the processing liquid supplied to the surface of the substrate to be processed after the processing of the surface of the substrate to be processed is ended, that is, the processing liquid whose cleanliness is relatively high.

Another preferred embodiment of the invention provides a substrate processing method including a substrate holding step of holding a substrate at a holding position surrounded by a cylindrical guard, a processing liquid supplying step of supplying a surface of the substrate to be processed with a processing liquid that process the surface of the substrate to be processed while rotating the substrate held at the holding position about a rotation axis passing through a central portion of the substrate, an image acquiring step of acquiring an image of the surface of the substrate to be processed and an image of an inner wall surface of the guard while supplying the processing liquid to the surface of the substrate to be processed, and a determining step of determining whether or not a predetermined change occurs in luminance values of the images obtained in the image acquiring step.

In a case where the predetermined change does not occur in the luminance values of the images obtained in the image acquiring step before a predetermined notification time elapses after a start time point of monitoring of the luminance values, a notifying step of notifying that the predetermined change does not occur in the luminance values of the images obtained in the image acquiring step is executed, and in a case where the predetermined change occurs in the luminance values of the images obtained in the image acquiring step before the notification time elapses after the start time point, a detecting step of detecting a processing end time point at which processing of the surface of the substrate to be processed with the processing liquid is ended is executed.

According to the substrate processing method, the processing liquid supplied to the surface of the substrate to be processed is received by the cylindrical guard that surrounds the substrate. While the processing liquid is supplied to the surface of the substrate to be processed, the images of both the surface to be processed and the inner wall surface of the guard are acquired, and it is determined whether or not the predetermined change occurs in the surface of the substrate to be processed.

In a case where the predetermined change occurs in the luminance values of the images obtained in the image acquiring step before the notification time elapses after the start time point of the monitoring of the luminance values, it is possible to detect the processing end time point based on both the substrate luminance value and the guard luminance value. Therefore, in comparison to the arrangement in which only one of the substrate luminance value and the guard luminance value is monitored, it is possible to favorably detect the end of the processing of the surface of the substrate to be processed.

On the other hand, in a case where the predetermined change does not occur in the luminance values of the images obtained in the image acquiring step after the notification time elapses after the start time point of the monitoring of the luminance values, notification is made to that effect. Therefore, it is possible to promptly notify that the processing end time point is not detected due to a detection abnormality. By stopping the substrate processing in accordance with the notification, it is possible to suppress consumption of the processing liquid at the time of the detection abnormality.

In a case of continuously processing a plurality of substrates, it is possible to calculate the notification time based on the processing end time point of the processed substrates. It is thereby possible to optimize the notification time.

Still another preferred embodiment of the invention provides a substrate processing method including a substrate holding step of holding a substrate at a holding position surrounded by a cylindrical guard, a processing liquid supplying a surface of the substrate to be processed with a processing liquid that process the surface of the substrate to be processed while rotating the substrate held at the holding position about a rotation axis passing through a central portion of the substrate, an image acquiring step of acquiring an image of the surface of the substrate to be processed and an image of an inner wall surface of the guard while supplying the processing liquid to the surface of the substrate to be processed, and a determining step of determining whether or not a predetermined change occurs in luminance values of the images obtained in the image acquiring step.

In a case where a processing end time point is not detected before a supply end time point at which supply of the processing liquid to the surface of the substrate to be processed is scheduled to end, a supply end time point extending step of extending the supply end time point is executed, and in a case where the predetermined change occurs in the luminance values of the images obtained in the image acquiring step before the supply end time point, a detecting step of detecting the processing end time point at which the processing of the surface of the substrate to be processed with the processing liquid is ended is executed.

According to the substrate processing method, the processing liquid supplied to the surface of the substrate to be processed is received by the cylindrical guard that surrounds the substrate. While the processing liquid is supplied to the surface of the substrate to be processed, both the images of the surface to be processed and the inner wall surface of the guard are acquired, and it is determined whether or not the predetermined change occurs in the surface of the substrate to be processed. In a case where the predetermined change occurs in the luminance values of the images obtained in the image acquiring step before the supply end time point, it is possible to detect the processing end time point based on both the substrate luminance value and the guard luminance value. Therefore, in comparison to the arrangement in which only one of the substrate luminance value and the guard luminance value is monitored, it is possible to favorably detect the end of the processing of the surface of the substrate to be processed.

The processing end time point is not always constant, but there is an individual difference for each substrate. In a case where the predetermined change does not occur in the luminance values of the images obtained in the image acquiring step before the supply end time point, the supply end time point is extended. Therefore, even in a case where the processing end time point is later than expected, it is possible to properly process the substrate.

Yet another preferred embodiment of the invention provides a substrate processing apparatus including a substrate holding unit that holds a substrate at a predetermined holding position, a substrate rotating unit that rotates the substrate held by the substrate holding unit, a processing liquid supplying unit that supplies a surface of the substrate to be processed held by the substrate holding unit with a processing liquid that process the surface of the substrate to be processed, a cylindrical guard that surrounds the substrate held by the substrate holding unit and receives the processing liquid scattered from the substrate, an image acquiring unit that acquires an image of the surface of the substrate to be processed held by the substrate holding unit and an image of an inner wall surface of the guard, and a detecting unit that monitors luminance values of the images acquired by the image acquiring unit and detects a processing end time point at which processing of the surface of the substrate to be processed with the processing liquid is ended.

According to the substrate processing apparatus, the processing liquid supplied to the surface of the substrate to be processed is received by the cylindrical guard that surrounds the substrate. While the processing liquid is supplied to the surface of the substrate to be processed, both the images of the surface to be processed and the inner wall surface of the guard are acquired, and the luminance values of the acquired images are monitored. Therefore, it is possible to detect the processing end time point based on both the substrate luminance value and the guard luminance value. Thus, in comparison to the arrangement in which only one of the substrate luminance value and the guard luminance value is monitored, it is possible to favorably detect the end of the processing of the surface of the substrate to be processed.

In yet another preferred embodiment of the invention, the detecting unit detects, as the processing end time point, a time point at which a predetermined change occurs in any one of the luminance value of the image of the surface of the substrate to be processed acquired by the image acquiring unit and the luminance value of the image of the inner wall surface of the guard acquired by the image acquiring unit. Therefore, even in a case where the change in the image luminance value or the guard luminance value when the processing of the surface of the substrate to be processed is ended is not sufficient, it is possible to promptly detect the end of the processing of the surface of the substrate to be processed.

In yet another preferred embodiment of the invention, the detecting unit detects, as the processing end time point, a time point at which, after a predetermined change occurs in one of the luminance value of the image of the surface of the substrate to be processed acquired by the image acquiring unit and the luminance value of the image of the inner wall surface of the guard acquired by the image acquiring unit, the predetermined change occurs in the other one of the luminance value of the image of the surface of the substrate to be processed acquired by the image acquiring unit and the luminance value of the image of the inner wall surface of the guard acquired by the image acquiring unit, or a time point at which a predetermined backup time elapses after the time point at which the predetermined change occurs in one of the luminance value of the image of the surface of the substrate to be processed acquired by the image acquiring unit and the luminance value of the image of the inner wall surface of the guard acquired by the image acquiring unit, whichever is earlier.

Even in a case where the processing of the surface of the substrate to be processed sufficiently progresses, there is sometimes a case where a residue generated by the processing of the surface of the substrate to be processed adheres to the inner wall surface of the guard. On the other hand, there is sometimes a case where the processing of the surface of the substrate to be processed does not sufficiently progress but the predetermined change occurs in the guard luminance value.

Even in cases like these, when the time point at which, after the predetermined change occurs in one of the substrate luminance value and the guard luminance value, the predetermined change occurs in the other one of the substrate luminance value and the guard luminance value, or the time point at which the predetermined backup time elapses after the time point at which the predetermined change occurs in one of the substrate luminance value and the guard luminance value, whichever is earlier, is detected as the processing end time point, it is possible to promptly detect a time point at which the processing of the surface of the substrate to be processed sufficiently progresses and the residue adhering to the inner wall surface of the guard is sufficiently removed.

In yet another preferred embodiment of the invention, the substrate processing apparatus further includes a heating unit that heats the processing liquid on the surface of the substrate to be processed held by the substrate holding unit, and weakens heating applied to the substrate at the processing end time point, a rinse liquid supplying unit that supplies to the surface of the substrate to be processed held by the substrate holding unit a rinse liquid that washes away the processing liquid, and a liquid switching unit that switches a liquid to be supplied to the surface of the substrate to be processed held by the substrate holding unit from the processing liquid to the rinse liquid after the processing end time point.

According to the substrate processing apparatus, the rinse liquid is not supplied to the surface of the substrate to be processed at the same time as the end of the processing of the surface of the substrate to be processed but the rinse liquid is supplied to the surface of the substrate to be processed after the heating applied to the substrate is weakened. That is, the rinse liquid is supplied to the surface of the substrate to be processed after a temperature of the substrate is lowered by stopping the heating applied to the substrate. Therefore, it is possible to ease a sudden decrease in the substrate temperature (heat shock) due to supply of the rinse liquid to the substrate. While favorably detecting the end of the processing of the surface of the substrate to be processed with the processing liquid, it is possible to smoothly wash away the processing liquid with the rinse liquid.

In yet another preferred embodiment of the invention, the substrate processing apparatus further includes a drain flow passage through which the processing liquid received by the guard is drained, a recovery flow passage through which the processing liquid scattered from the substrate held by the substrate holding unit is recovered, and a flow passage switching unit that switches a discharge destination of the processing liquid scattered from the substrate from the drain flow passage to the recovery flow passage at the processing end time point.

Therefore, it is possible to switch the discharge destination of the processing liquid to the recovery flow passage at an appropriate time point at which the processing of the surface of the substrate to be processed is ended. Thus, while favorably detecting the end of the processing of the surface of the substrate to be processed, it is possible to recover the processing liquid supplied to the surface of the substrate to be processed after the processing of the surface of the substrate to be processed is ended, that is, the processing liquid whose cleanliness is relatively high.

In yet another preferred embodiment of the invention, the substrate processing apparatus further includes a notifying unit that notifies that the processing end time point is not detected in a case where the detecting unit does not detect the processing end time point before a predetermined notification time elapses after a start time point of monitoring of the luminance values. Therefore, it is possible to promptly notify that the processing end time point is not detected due to a detection abnormality. By stopping the substrate processing in accordance with the notification, it is possible to suppress consumption of the processing liquid at the time of the detection abnormality.

In a case of continuously processing a plurality of substrates, it is possible to calculate the notification time based on the processing end time point of the processed substrates. It is thereby possible to optimize the notification time.

In yet another preferred embodiment of the invention, the substrate processing apparatus further includes a supply end time point extending unit that extends a supply end time point at which supply of the processing liquid to the surface of the substrate to be processed held by the substrate holding unit is scheduled to end in a case where the detecting unit does not detect the processing end time point before the supply end time point is passed.

The processing end time point is not always constant, but there is an individual difference for each substrate. In a case where the predetermined change does not occur in the luminance values of the images obtained in the image acquiring step before the supply end time point, the supply end time point is extended. Therefore, even in a case where the processing end time point is later than expected, it is possible to properly process the substrate.

The above and other objects, features, and advantages of the present invention will become more apparent from the following detailed description of the preferred embodiments with reference to the attached drawings.

BRIEF DESCRIPTION OF DRAWINGS

FIG. 6 is a flow chart for describing a specific flow of substrate processing by the substrate processing apparatus.

FIG. 7 is a time chart regarding major actions in the substrate processing.

FIG. 9 is a flow chart showing a flow of a first example of end time point detection processing to be executed by a controller provided in the processing unit.

DESCRIPTION OF EMBODIMENTS

<Arrangement of Substrate Processing Apparatus>

Figure 1:
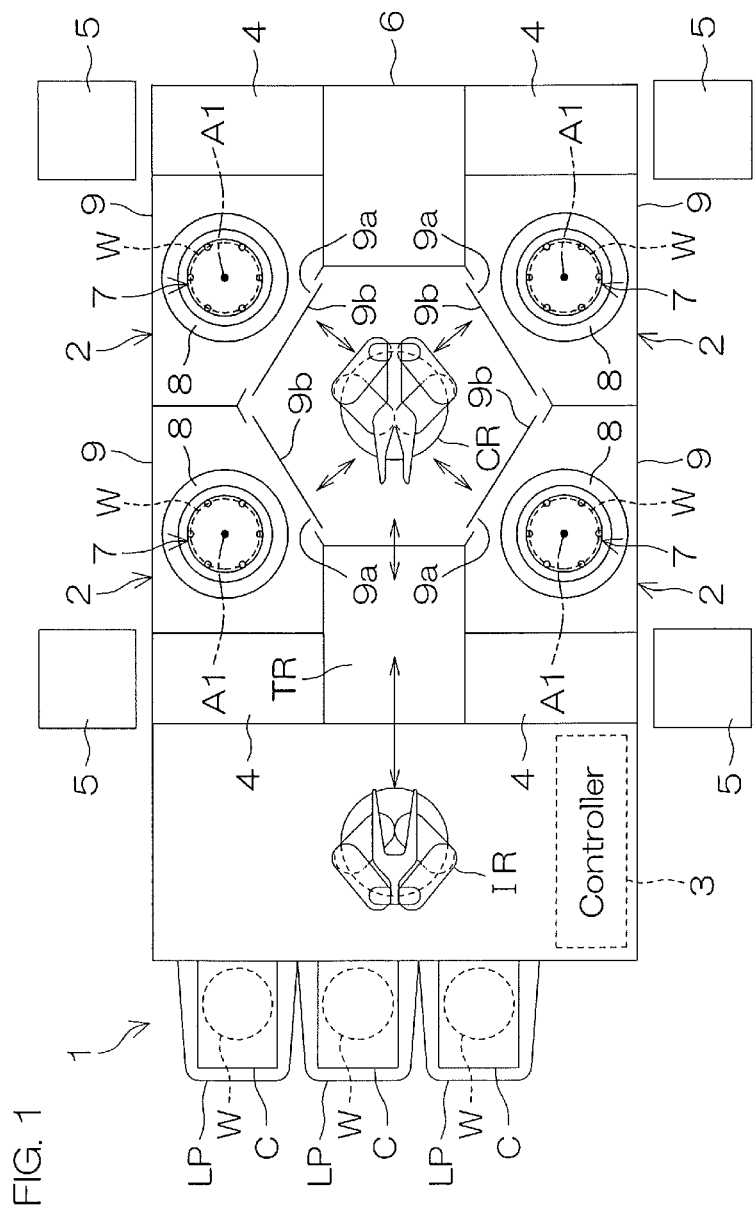
FIG. 1 is a plan view for describing an arrangement of a substrate processing apparatus according to a first preferred embodiment of the invention.

FIG. 1 is a plan view for describing an arrangement of a substrate processing apparatus 1 according to a first preferred embodiment of the invention.

The substrate processing apparatus 1 is an apparatus that processes substrates W such as silicon wafers. The substrate processing apparatus 1 is, for example, a single substrate processing type substrate processing apparatus (single substrate processing apparatus) that continuously processes the substrates W one at a time.

In the preferred embodiment, the substrates W are disk-shaped substrates. Each of the substrates W has a pair of principal surfaces.

At least one of the pair of principal surfaces is a device surface where circuit patterns are formed. One of the pair of principal surfaces may be a non-device surface where circuit patterns are not formed. A resist film is formed on the device surface of the substrate W. In the preferred embodiment, the substrate is processed in a posture that the device surface faces upward. In the preferred embodiment, an upper surface of the substrate W is a surface to be processed with a processing liquid.

As a resist composition which constitutes the resist film, a positive type resist composition and a negative type resist composition, etc., can be used. The positive type resist composition includes, for example, a composition composed of a quinonediazide-based photosensitizing agent and an alkali-soluble resin, and a chemically-amplified resist composition.

The negative type resist composition includes, for example, a composition that contains a highly polymerized compound having a photosensitive group such as poly(vinyl cinnamate), a composition that contains aromatic azide compound or that contains an azide compound composed of cyclized rubber and a bisazide compound, a composition that contains a diazo resin, a photopolymerization composition that contains an addition polymerizable unsaturated compound, and a chemically-amplified negative type resist composition.

Here, examples of the quinone diazide-based photosensitizing agent used in the positive type resist composition composed of the quinone diazide-based photosensitizing agent and the alkali-soluble resin include 1,2-benzoquinone diazide-4-sulfonic acid, 1,2-naphthoquinone diazide-4-sulfonic acid, 1,2-naphthoquinone diazide-5-sulfonic acid, and esters or amides of these sulfonic acids. Further, examples of the alkali-soluble resin include a novolak resin, polyvinyl phenol, polyvinyl alcohol, and a copolymer of acrylic acid and methacrylic acid. Preferable novolak resins include those produced from one or two or more types of phenols such as phenol, o-Cresol, m-Cresol, p-Cresol, and xylenol, and one or more types of aldehydes such as formaldehyde, paraformaldehyde, etc.

Further, the chemically-amplified resist composition may include either a positive type or a negative type. The chemically-amplified resist is a resist that produces an acid by irradiation to change the solubility of an irradiated portion to a developer by a chemical change due to catalysis of the acid, thereby forming a pattern and includes, for example, a resist that is composed of an acid producing compound which produces an acid by irradiation and an acid-sensitive group-containing resin which is decomposed in the presence of an acid and produces an alkali-soluble group such as a phenol hydroxyl group or a carboxyl group, and a resist that is composed of an alkali-soluble resin, a cross-linking agent, and an acid producing agent.

The substrate processing apparatus 1 includes a plurality of processing units 2 that process substrates W with a liquid, load ports LP on which carriers C that house the plurality of substrates W to be processed by the processing units 2 are mounted, transfer robots IR and CR that transfer the substrates W between the load ports LP and the processing units 2, and a controller 3 that controls the substrate processing apparatus 1.

The transfer robot IR transfers the substrate W between the carrier C and the transfer robot CR. The transfer robot CR transfers the substrate W between the transfer robot IR and the processing unit 2. The transfer robots IR and CR are disposed on a transfer route TR extending from the plurality of load ports LP toward the plurality of processing units 2.

The plurality of processing units 2 have the same arrangements, for example. Although details will be described later, a liquid supplied toward the substrate in the processing unit 2 includes a remover liquid (processing liquid) and a rinse liquid, etc.

The plurality of processing units 2 form four processing towers respectively disposed at four positions which are separated horizontally from each other. Each of the processing towers includes the plurality of (for example, three) processing units 2 laminated in an up and down direction. Each two of the four processing towers are disposed on each of both sides of the transfer route TR.

The substrate processing apparatus 1 includes a plurality of fluid boxes 4 that house valves, pipes, etc., and storage boxes 5 that house tanks in which the remover liquid, the rinse liquid, or material liquids for these liquids are stored. The processing units 2 and the fluid boxes 4 are disposed inside a frame 6 in a substantially square shape in a plan view. The storage boxes 5 are disposed outside the frame 6 in the example of FIG. 1. The storage boxes 5 may be disposed inside the frame 6 unlike the example of FIG. 1. The same number of storage boxes 5 as the plurality of fluid boxes 4 are provided, for example. The liquid stored in each of the storage boxes 5 is supplied, via the fluid box 4 corresponding to the storage box 5, to the plurality of (for example, three) processing units 2 constituting the processing tower which corresponds to the fluid box 4.

Unlike the preferred embodiment, the liquid may be arranged to be supplied from a single storage box 5 to all the fluid boxes 4.

Each of the processing units 2 includes a spin chuck 7 that rotates the substrate W about a rotation axis A1 (vertical axis) while horizontally holding the substrate W, a processing cup 8 that surrounds the spin chuck 7 and receives the liquid scattered from the substrate W, and a chamber 9 that houses the spin chuck 7 and the processing cup 8. The rotation axis A1 is a vertical straight line passing through a central portion of the substrate W.

An inlet/outlet 9a for carrying the substrate W in and carrying the substrate W out by the transfer robot CR is formed in the chamber 9. A shutter unit 9b that opens and closes the inlet/outlet 9a is provided in the chamber 9.

Figure 2:
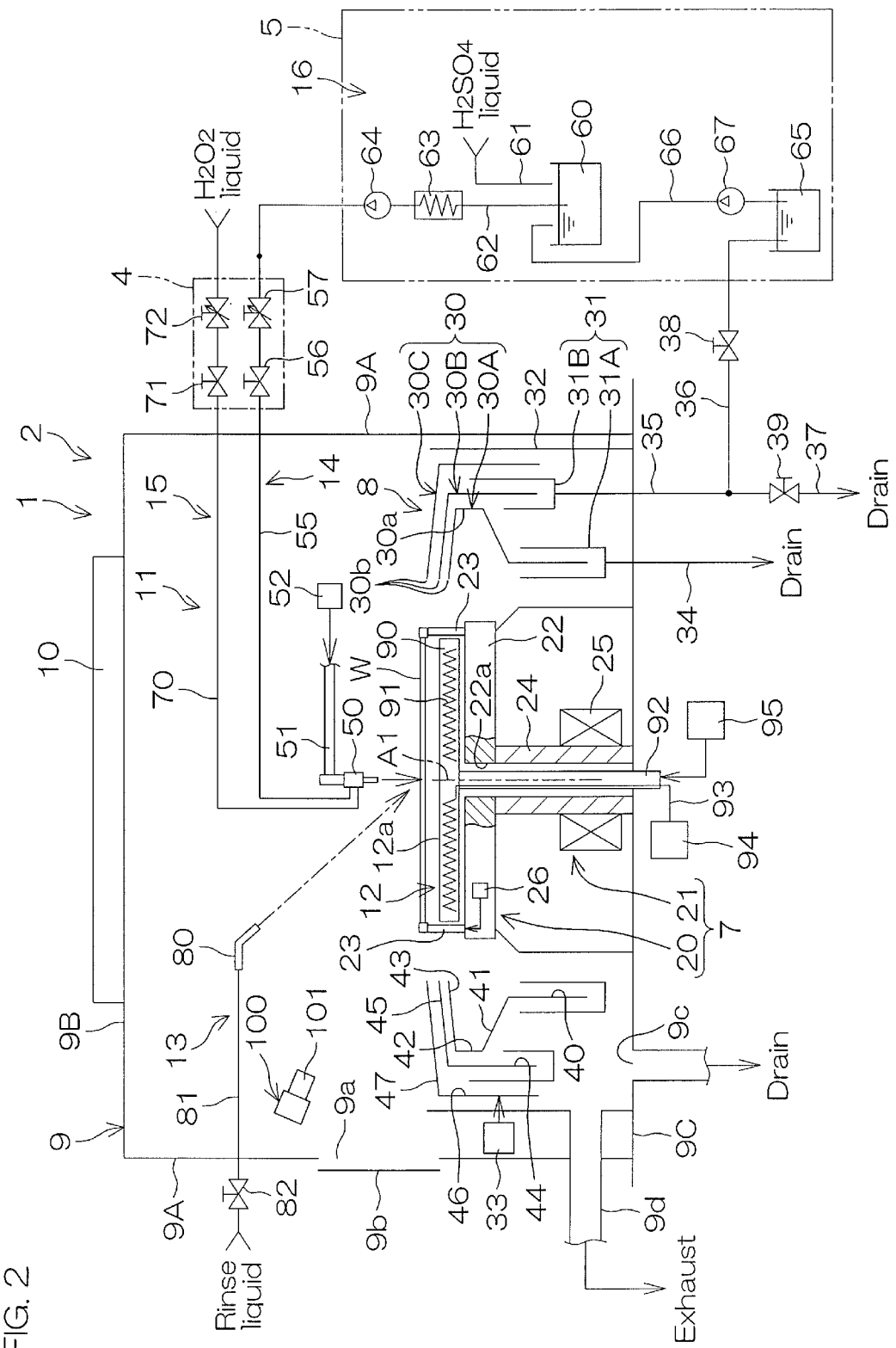
FIG. 2 is a schematic sectional view for describing an arrangement example of a processing unit provided in the substrate processing apparatus.

FIG. 2 is a schematic sectional view for describing an arrangement example of the processing unit 2.

The chamber 9 includes a side wall 9A in a substantially square tube shape that surrounds the spin chuck 7 and the processing cup 8, an upper wall 9B disposed higher than the spin chuck 7, and a lower wall 9C that supports the spin chuck 7. Above the upper wall 9B of the chamber 9, a fan filter unit (FFU) 10 that feeds the clean air (air filtered by a filter) is provided. The clean air is supplied from the FFU 10 into the chamber 9, and the clean air supplied into the chamber 9 is discharged from the chamber 9 via an exhaust duct 9d provided in a lower end portion of the side wall 9A.

The spin chuck 7 includes a substrate holding unit 20 that holds the substrate W at a predetermined holding position, and a substrate rotating unit 21 that rotates the substrate holding unit 20 about the rotation axis A1. The spin chuck 7 is an example of a substrate holding and rotating unit. The holding position is a position of the substrate W shown in FIG. 2, the position at which the substrate W is held in a horizontal posture.

The substrate holding unit 20 includes a spin base 22 having a disk shape along a horizontal direction, and a plurality of chuck pins 23 that grip the substrate W above the spin base 22 and hold the substrate W at the holding position. The plurality of chuck pins 23 are disposed on an upper surface of the spin base 22 at intervals in a circumferential direction of the spin base 22. The substrate holding unit 20 is also referred to as the substrate holder.

The substrate rotating unit 21 includes a rotation shaft 24 whose upper end is coupled to the spin base 22, the rotation shaft extending in a vertical direction, and a spin motor 25 that rotates the rotation shaft 24 about the central axis (rotation axis A1). By rotating the rotation shaft 24 by the spin motor 25, the spin base 22 and the plurality of chuck pins 23 are rotated about the rotation axis A1.

The plurality of chuck pins 23 are capable of being opened and closed between a closed state where the chuck pins 23 are in contact with a peripheral end of the substrate W and grip the substrate W, and an opened state where the chuck pins 23 are retreated from the peripheral end of the substrate W. The plurality of chuck pins 23 are opened and closed by an opening/closing unit 26. In the closed state, the plurality of chuck pins 23 horizontally hold (clamp) the substrate W. In the opened state, the plurality of chuck pins 23 release gripping of a peripheral edge portion of the substrate W while in contact with a peripheral edge portion of a lower surface of the substrate W and supporting the substrate W from below.

The opening/closing unit 26 includes, for example, a link mechanism housed inside the spin base 22, and a drive source disposed outside the spin base 22. The drive source is an actuator such as an air cylinder or an electric motor.

The processing cup 8 includes a plurality of guards 30 that receive the liquid scattered outward from the substrate W held by the spin chuck 7, a plurality of cups 31 that receive the liquid guided downward by the plurality of guards 30, and a cylindrical outer wall member 32 that surrounds the plurality of guards 30 and the plurality of cups 31.

The preferred embodiment shows an example in which three guards 30 (of a first guard 30A, a second guard 30B, and a third guard 30C), and two cups 31 (of a first cup 31A and a second cup 31B) are provided.

Each of the guards 30 has a substantially tubular shape (typically, a cylindrical shape) which is rotationally symmetric with respect to the rotation axis A1. The plurality of guards 30 are coaxially disposed. An upper end portion of each of the guards 30 is inclined inward toward the spin base 22 (in a direction of approaching the rotation axis A1 of the substrate W). The cup 31 forms an annular liquid receiving groove that receives the liquid guided downward by the guard 30. The liquid received by the cup 31 is drained or recovered.

Each of the guards 30 is formed of, for example, a chemical-resistant resin material. The chemical-resistant resin material includes, for example, fluorine resin such as tetrafluoroethylene-perfluoroalkyl vinyl ether copolymer (PFA), polychloro trifluoro ethylene (PCTFE), and polytetrafluoroethylene (PTFE). The entire wall surface of the guard 30 is white.

The first guard 30A is disposed to surround the spin base 22. The second guard 30B is disposed to surround the spin base 22 at a position further outward than the first guard 30A. The third guard 30C is disposed to surround the spin base 22 at a position further outward than the second guard 30B. Each of the guards 30 surrounds the substrate W placed at the holding position.

The first cup 31A receives the liquid guided downward by the first guard 30A. The second cup 31B receives the liquid guided downward by the second guard 30B. The liquid received by the third guard 30C is drained from a drain port 9c opened on the lower wall 9C of the chamber 9, for example.

The innermost first guard 30A includes a substantially tubular cylindrical inner side cylindrical portion 40 surrounding a circumference of the spin chuck 7 and extending in the vertical direction, a substantially ring-shaped lower side inclined portion 41 extending obliquely upward from an upper end of the inner side cylindrical portion 40 to the outer side (in a direction away from the rotation axis A1 of the substrate W), a substantially tubular outer side cylindrical portion 42 extending upward from an outer end of the lower side inclined portion 41, and a substantially ring-shaped upper side inclined portion 43 extending obliquely upward from an upper end of the outer side cylindrical portion 42 to the inner side (in the direction approaching the rotation axis A1 of the substrate W).

The second-innermost second guard 30B has a substantially tubular cylindrical portion 44 extending in the vertical direction, and a substantially ring-shaped inclined portion 45 extending obliquely upward from an upper end of the cylindrical portion 44 to the central side (in the direction approaching the rotation axis A1 of the substrate W). The outermost third guard 30C has the same arrangement as the second guard 30B. That is, the third guard 30C has a substantially tubular cylindrical portion 46 extending in the vertical direction, and a substantially ring-shaped inclined portion 47 extending obliquely upward from an upper end of the cylindrical portion 46 to the central side (in the direction approaching the rotation axis A1 of the substrate W).

The upper side inclined portion 43 of the first guard 30A, the inclined portion 45 of the second guard 30B, and the inclined portion 47 of the third guard 30C overlap up and down in this order so that the upper side inclined portion 43 of the first guard 30A is placed on the lowermost side.

The processing unit 2 further includes a guard raising/lowering unit 33 that raises and lowers the plurality of guards 30 individually. Each of the guards 30 is raised and lowered between an upper position at which an upper end portion 30b of the guard 30 is placed higher than the upper surface of the substrate W placed at the holding position, and a lower position at which the upper end portion 30b of the guard 30 is placed lower than the upper surface of the substrate W placed at the holding position.

A suspending portion 48 extending downward (see FIGS. 8A to 8C described later) may be provided in an inner end of each of the upper side inclined portion 43 of the first guard 30A, the inclined portion 45 of the second guard 30B, and the inclined portion 47 of the third guard 30C. In that case, when the guard 30 is placed at the upper position, a lower end portion of the suspending portion 48 is placed higher than the upper surface of the substrate W, and when the guard 30 is placed at the lower position, the upper end portion 30b of the guard 30 is placed lower than the upper surface of the substrate W.

The guard raising/lowering unit 33 includes, for example, a plurality of motors (not shown) that respectively apply a driving force to the plurality of guards 30. The driving force of each of the motors is transmitted to the corresponding guard 30 via a ball screw mechanism (not shown) coupled with the guard. The guard raising/lowering unit 33 is also referred to as the guard lifter.

When the liquid is supplied to the rotating substrate W, at least one of the guards 30 is disposed at the upper position. When the plurality of guards 30 are disposed in a first liquid receiving disposition (see FIGS. 8A and 8C described later) where all the guards 30 are placed at the upper position, the liquid scattered from the substrate W is received by the first guard 30A.

When the plurality of guards 30 are disposed in a second liquid receiving disposition (see FIG. 8B described later) where the first guard 30A is placed at the lower position, and the second guard 30B and the third guard 30C are placed at the upper position, the liquid scattered from the substrate W is received by the second guard 30B.

When the plurality of guards 30 are disposed in a third liquid receiving disposition at which the first guard 30A and the second guard 30B are placed at the lower position, and the third guard 30C is placed at the upper position, the liquid scattered from the substrate W is received by the third guard 30C.

When the transfer robot CR (see FIG. 1) accesses the spin chuck 7 for carrying in and carrying out the substrate W, the plurality of guards 30 are disposed in a carry-in/carry-out disposition at which all the guards 30 are placed at the lower position.

A first drain piping 34 is connected to a bottom portion of the first cup 31A. The liquid introduced to the first drain piping 34 is fed to a drain device (not shown), and processed in the device. The first drain piping 34 is an example of a drain flow passage.

A common piping 35 used for draining and recovery of the liquid is connected to a bottom portion of the second cup 31B. The common piping 35 is branched and connected to a recovery piping 36 connected to a sulfuric acid aqueous solution supply source 16 (to be described later), and a second drain piping 37 connected to the drain device (not shown). A recovery valve 38 is interposed in the recovery piping 36, and a drain valve 39 is interposed in the second drain piping 37. When the recovery valve 38 is opened, the liquid flowing through the common piping 35 is guided to the recovery piping 36. In addition, when the drain valve 39 is opened, the liquid flowing through the common piping 35 is guided to the second drain piping 37.

The processing unit 2 further includes a remover liquid supplying unit 11 that supplies the remover liquid with which the resist film is removed from the upper surface of the substrate W held by the spin chuck 7, a heater unit 12 that heats the remover liquid on the substrate W via the substrate W, and a rinse liquid supplying unit 13 that supplies to the upper surface of the substrate W the rinse liquid that washes away the remover liquid from the upper surface of the substrate W held by the spin chuck 7. The remover liquid supplying unit 11 is an example of a processing liquid supplying unit.

The remover liquid supplying unit 11 includes a remover liquid nozzle 50 that ejects the remover liquid toward the upper surface of the substrate W, a nozzle arm 51 that supports the remover liquid nozzle 50, and a nozzle moving unit 52 that moves the remover liquid nozzle 50 by moving the nozzle arm 51. The remover liquid nozzle 50 is, for example, a nozzle that ejects the remover liquid downward as a continuous flow. The nozzle arm 51 extends in the horizontal direction.

The nozzle moving unit 52 horizontally moves the remover liquid nozzle 50 by horizontally moving the nozzle arm 51 about a turning axis. The nozzle moving unit 52 moves the remover liquid nozzle 50 in the horizontal direction between a central position at which the remover liquid ejected from the remover liquid nozzle 50 lands on a central region of the upper surface of the substrate W, and a retreat position at which the remover liquid nozzle 50 is set outside the processing cup 8 in a plan view. The central region of the upper surface of the substrate W is a region of rotation center of the upper surface of the substrate W and the circumference of the rotation center.

The nozzle moving unit 52 includes, for example, a turning shaft (not shown) coupled with the nozzle arm 51 and extending along the vertical direction, and a turning actuator (not shown) such as a motor that turns the turning shaft.

In the preferred embodiment, as the remover liquid, a sulfuric acid/hydrogen peroxide mixture (SPM liquid), that is, a mixture liquid of a sulfuric acid aqueous solution ($H_2SO_4$ solution) and a hydrogen peroxide solution ($H_2O_2$ solution) is used. The remover liquid supplying unit 11 is also referred to as a SPM liquid supplying unit. The liquid that can be used as the remover liquid includes a sulfuric acid aqueous solution (dilute sulfuric acid) and ozone water, etc., in addition to the SPM liquid.

In the preferred embodiment, the remover liquid supplying unit 11 is arranged to form the SPM liquid as the remover liquid by mixing a hydrogen peroxide solution and a sulfuric acid aqueous solution in the remover liquid nozzle 50. Therefore, the remover liquid supplying unit 11 further includes a sulfuric acid aqueous solution unit 14 that feeds the sulfuric acid aqueous solution to the remover liquid nozzle 50, and a hydrogen peroxide solution unit 15 that feeds the hydrogen peroxide solution to the remover liquid nozzle 50.

The sulfuric acid aqueous solution unit 14 includes a sulfuric acid aqueous solution piping 55 connected to the remover liquid nozzle 50, a sulfuric acid aqueous solution valve 56 that opens and closes the sulfuric acid aqueous solution piping 55, a sulfuric acid aqueous solution flow rate adjusting valve 57 that adjusts a flow rate of the sulfuric acid aqueous solution in the sulfuric acid aqueous solution piping 55, and the sulfuric acid aqueous solution supply source 16 that stores the sulfuric acid aqueous solution and supplies the sulfuric acid aqueous solution to the sulfuric acid aqueous solution piping 55. The sulfuric acid aqueous solution valve 56 and the sulfuric acid aqueous solution flow rate adjusting valve 57 are housed in the fluid box 4. The sulfuric acid aqueous solution supply source 16 is housed in the storage box 5.

The sulfuric acid aqueous solution supply source 16 includes a sulfuric acid aqueous solution tank 60 that stores the sulfuric acid aqueous solution, a sulfuric acid aqueous solution supplement piping 61 through which a new liquid of the sulfuric acid aqueous solution is supplemented to the sulfuric acid aqueous solution tank 60, a sulfuric acid aqueous solution supply piping 62 connected to the sulfuric acid aqueous solution tank 60 and the sulfuric acid aqueous solution piping 55, a first pump 64 that moves the sulfuric acid aqueous solution in the sulfuric acid aqueous solution tank 60 to the sulfuric acid aqueous solution supply piping 62, and a heating unit 63 that heats the sulfuric acid aqueous solution in the sulfuric acid aqueous solution supply source 16.

The heating unit 63 is, for example, a heater that heats a portion to be heated set in the sulfuric acid aqueous solution supply piping 62. Unlike the example shown in FIG. 2, the heating unit 63 may be a heater that is immersed in the sulfuric acid aqueous solution stored in the sulfuric acid aqueous solution tank 60 and that directly heats the sulfuric acid aqueous solution in the sulfuric acid aqueous solution tank 60.

The sulfuric acid aqueous solution supply source 16 may further include a filter that filters the sulfuric acid aqueous solution flowing through the sulfuric acid aqueous solution supply piping 62, and a thermometer that measures a temperature of the sulfuric acid aqueous solution flowing through the sulfuric acid aqueous solution supply piping 62.

The hydrogen peroxide solution unit 15 includes a hydrogen peroxide solution piping 70 connected to the remover liquid nozzle 50, a hydrogen peroxide solution valve 71 for opening and closing the hydrogen peroxide solution piping 70, and a hydrogen peroxide solution flow rate adjusting valve 72 that adjusts a flow rate of the hydrogen peroxide solution flowing in the hydrogen peroxide solution piping 70 by adjusting an opening degree of the hydrogen peroxide solution valve 71. The hydrogen peroxide solution valve 71 and the hydrogen peroxide solution flow rate adjusting valve 72 are housed in the fluid box 4. A normal temperature (such as 23° C.) of hydrogen peroxide solution whose temperature is not adjusted is supplied to the hydrogen peroxide solution piping 70 from a hydrogen peroxide solution supply source (not shown) housed in the storage box 5.

When the sulfuric acid aqueous solution valve 56 and the hydrogen peroxide solution valve 71 are opened, the sulfuric acid aqueous solution and the hydrogen peroxide solution are supplied into a casing (not shown) of the remover liquid nozzle 50, and sufficiently mixed (agitated) in the casing. By the mixing, the sulfuric acid aqueous solution and the hydrogen peroxide solution are uniformly mixed with each other, and the SPM liquid is produced by reaction between the sulfuric acid aqueous solution and the hydrogen peroxide solution. The SPM liquid contains highly oxidative peroxymonosulfuric acid ($H_2SO_5$), and a temperature of the SPM liquid is increased to a higher temperature than temperatures of the sulfuric acid aqueous solution and the hydrogen peroxide solution before the mixing (not less than 100° C., for example, 160 to 220° C.). The produced high-temperature SPM liquid is ejected from an ejection port opened at a leading end (such as a lower end) of the casing of the remover liquid nozzle 50.

By adjusting opening degrees of the sulfuric acid aqueous solution flow rate adjusting valve 57 and the hydrogen peroxide solution flow rate adjusting valve 72, it is possible to adjust a mixing ratio between the sulfuric acid aqueous solution and the hydrogen peroxide solution in the SPM liquid ejected from the remover liquid nozzle 50. The mixing ratio is adjusted within a range of $H_2SO_4$ solution: $H_2O_2$ solution=20:1 to 2:1, more preferably within a range of $H_2SO_4$ solution:$H_2O_2$ solution=10:1 to 5:1.

The sulfuric acid aqueous solution supply source 16 recovers the SPM liquid used for processing of the substrate W and reuses it as the sulfuric acid aqueous solution. The sulfuric acid aqueous solution supply source 16 further includes a recovery tank 65 that recovers the SPM liquid used for the processing of the substrate W via the recovery piping 36, a liquid feeding piping 66 connected to the recovery tank 65 and the sulfuric acid aqueous solution tank 60, and a second pump 67 that moves the sulfuric acid aqueous solution produced in the recovery tank 65 to the liquid feeding piping 66.

In detail, the sulfuric acid aqueous solution supply source 16 stores the SPM liquid recovered via the recovery piping 36 in the recovery tank 65. Over time, hydrogen peroxide in the SPM liquid is decomposed, and the SPM liquid stored in the recovery tank 65 is changed into the sulfuric acid aqueous solution. The sulfuric acid aqueous solution produced by decomposition of hydrogen peroxide is fed from the recovery tank 65 to the sulfuric acid aqueous solution tank 60 via the liquid feeding piping 66. The SPM liquid is thereby reused as the sulfuric acid aqueous solution.

Unlike the example shown in FIG. 2, the arrangement of the recovery tank 65 may be omitted, and an arrangement in which the sulfuric acid aqueous solution recovered by the processing cup 8 is directly supplied from the processing cup 8 to the sulfuric acid aqueous solution tank 60 may be adopted.

The rinse liquid supplying unit 13 includes a rinse liquid nozzle 80 that ejects the rinse liquid as a continuous flow, a rinse liquid piping 81 through which the rinse liquid is guided to the rinse liquid nozzle 80, and a rinse liquid valve 82 that is interposed in the rinse liquid piping 81 and that opens and closes a flow passage in the rinse liquid piping 81. The rinse liquid nozzle 80 is fixed above the spin chuck 7 in a state where an ejection port faces the central region of the upper surface of the substrate W. When the rinse liquid valve 82 is opened, the rinse liquid supplied from the rinse liquid piping 81 to the rinse liquid nozzle 80 is ejected from the ejection port of the rinse liquid nozzle 80.

The rinse liquid is, for example, deionized water (DIW). The rinse liquid is not limited to DIW but may be any of carbonated water, electrolyzed ion water, hydrogen water, ozone water, diluted ammonia water (for example, approximately not less than 10 ppm and not more than 100 ppm), and aqueous hydrochloric acid solution of dilute concentration (for example, approximately not less than 10 ppm and not more than 100 ppm).

Unlike the preferred embodiment, the rinse liquid supplying unit 13 may include a nozzle moving unit that scans a liquid landing position of the rinse liquid with respect to the upper surface of the substrate W within the surface of the substrate W by horizontally moving the rinse liquid nozzle 80.

The heater unit 12 has a form of a disk-shaped hot plate. The heater unit 12 is disposed between the upper surface of the spin base 22 and the lower surface of the substrate W. The heater unit 12 has a facing surface 12a that faces the lower surface of the substrate W from below.

The heater unit 12 includes a plate main body 90 and a heater 91. The plate main body 90 is slightly smaller than the substrate W in a plan view. An upper surface of the plate main body 90 constitutes the facing surface 12a. The heater 91 may be a resistance element built in the plate main body 90. The heater 91 is energized to heat the facing surface 12a.

A raising/lowering shaft 92 extending in the vertical direction along the rotation axis A1 is coupled with a lower surface of the heater unit 12. The raising/lowering shaft 92 is inserted into a through hole 22a formed in a central portion of the spin base 22, and the hollow rotation shaft 24. A power feeder line 93 passes through in the raising/lowering shaft 92.

Electric power is supplied from a heater energizing unit 94 to the heater 91 via the power feeder line 93. The heater energizing unit 94 is, for example, a power source. The heater unit 12 is raised and lowered by a heater raising/lowering unit 95.

The heater raising/lowering unit 95 includes, for example, an actuator (not shown) such as an electric motor or an air cylinder that drives to raise and lower the raising/lowering shaft 92. The heater raising/lowering unit 95 is also referred to as the heater lifter.

The heater raising/lowering unit 95 raises and lowers the heater unit 12 via the raising/lowering shaft 92. The heater unit 12 can be raised and lowered by the heater raising/lowering unit 95 and placed at a lower position and an upper position. The heater raising/lowering unit 95 can dispose the heater unit 12 not only at the lower position and the upper position but also at an arbitrary position between the lower position and the upper position.

At the time of being raised, the heater unit 12 can receive the substrate W from the plurality of chuck pins 23 in the opened state. The heater unit 12 can heat the substrate W by being disposed at a contact position at which the heater unit 12 is in contact with the lower surface of the substrate W, or a proximity position at which the heater unit 12 approximates to the lower surface of the substrate W by the heater raising/lowering unit 95.

The contact position is a contact heating position at which a heat amount of the heater unit 12 is directly transmitted to the substrate W and the substrate W is heated. The proximity position is a proximity heating position at which the heater unit 12 approximates to the lower surface of the substrate W without making contact to the extent that the substrate W is sufficiently heated by radiation. At the contact position or the proximity position, the heater unit 12 heats the liquid on the substrate W via the substrate W. When the heater unit 12 is placed at the proximity position, the substrate W is heated to, for example, not less than 160° C. and not more than 220° C. When the heater unit 12 is placed at the contact position, the substrate W is heated to a higher temperature than when the heater unit 12 is placed at the proximity position, for example, within a range of not less than 160° C. and not more than 220° C.

The heater raising/lowering unit 95 can dispose the heater unit 12 at a separating position which is further separated from the lower surface of the substrate W than the proximity position. The separating position is a weakened heating position at which heating applied to the substrate W is weakened more than the proximity position. The separating position may be a non-heating position at which the heater unit 12 is separated from the lower surface of the substrate W to the extent that the substrate W is not heated.

The processing unit 2 further includes an image acquiring unit 100 (imaging unit) that acquires (images) images of the upper surface of the substrate W and an inner wall surface 30a of the first guard 30A. The inner wall surface 30a of the first guard 30A is constituted of an inner peripheral surface of the inner side cylindrical portion 40, an upper surface of the lower side inclined portion 41, an inner peripheral surface of the outer side cylindrical portion 42, and a lower surface of the upper side inclined portion 43. In the preferred embodiment, the image of the inner wall surface 30a of the first guard 30A acquired by the image acquiring unit 100 is mainly constituted of an image of the inner peripheral surface of the outer side cylindrical portion 42.

As a matter of course, the image of the inner wall surface 30a of the first guard 30A acquired by the image acquiring unit 100 may include the inner peripheral surface of the inner side cylindrical portion 40, the upper surface of the lower side inclined portion 41, and the lower surface of the upper side inclined portion 43 that constitutes the inner wall surface 30a of the first guard 30A.

The image acquiring unit 100 includes a camera 101 and a light source (not shown). The camera 101 includes a lens, an imaging element that converts an optical image formed by the lens into an electrical signal, and an imaging circuit that produces an image signal based on the converted electrical signal and transmits image data constituted of the image signal and time information to the controller 3. The imaging element is, for example, a charge coupled device (CCD) sensor or a complementary metal oxide semiconductor (CMOS) sensor.

The camera 101 may be a high-speed camera capable of imaging at a rate of several thousand to several ten thousand images per second, or may be a general camera capable of imaging at a rate of approximately ten to one hundred images per second. The image acquiring unit 100 is fixed to the side wall 9A of the chamber 9, and takes an image of the upper surface of the substrate W and the inner wall surface 30a of the first guard 30A from an obliquely upward position.

The image acquiring unit 100 acquires images, for example, at predetermined time intervals (such as at intervals of one second), and transmits the image data to the controller 3 each time an image is acquired. After a plurality of images are acquired, data including the plurality of images and time information corresponding to the images may be transmitted to the controller 3 as the image data.

The light source illuminates the upper surface of the substrate W and the inner wall surface 30a of the first guard 30A. The light source is, for example, a light source of white light.

Although details will be described later, in accordance with the degree of progress of processing of the upper surface of the substrate W with the remover liquid, luminance of the images of the upper surface of the substrate W and the inner wall surface 30a of the first guard 30A changes. By monitoring a change in the luminance of the images of the upper surface of the substrate W and the inner wall surface 30a of the first guard 30A, it is possible to determine whether or not the processing with the remover liquid is ended. In the preferred embodiment, the remover liquid is the SPM liquid. Thus, the "processing with the remover liquid" means removal of the resist film exposed from the upper surface of the substrate W from the upper surface of the substrate W.

<Electrical Configuration of Substrate Processing Apparatus>

Figure 3:
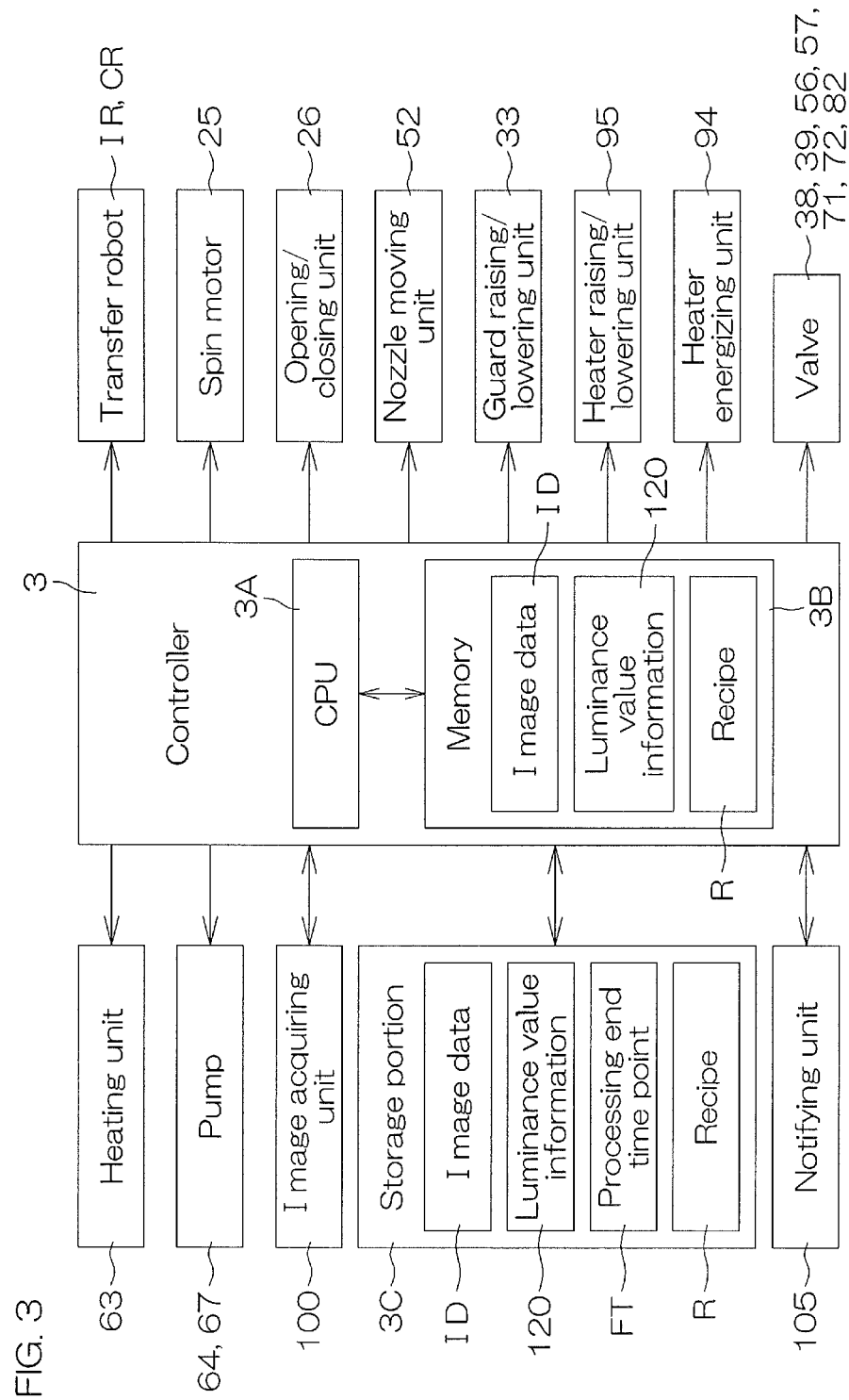
FIG. 3 is a block diagram for describing an electrical configuration of the substrate processing apparatus.

FIG. 3 is a block diagram for describing an electrical configuration of the substrate processing apparatus 1.

The controller 3 includes a microcomputer including a processor (CPU 3A) and a memory 3B (such as a volatile memory or a non-volatile memory). The controller 3 is configured to execute various controls for substrate processing by the processor executing control programs.

The transfer robots IR, CR, the spin motor 25, the opening/closing unit 26, the nozzle moving unit 52, the guard raising/lowering unit 33, the heater raising/lowering unit 95, the heater energizing unit 94, the image acquiring unit 100, the heating unit 63, the first pump 64, the second pump 67, the recovery valve 38, the drain valve 39, the sulfuric acid aqueous solution valve 56, the sulfuric acid aqueous solution flow rate adjusting valve 57, the hydrogen peroxide solution valve 71, the hydrogen peroxide solution flow rate adjusting valve 72, the rinse liquid valve 82, etc., are electrically connected to the controller 3.

The controller 3 controls the members that constitute the substrate processing apparatus 1 according to a recipe R set in the memory 3B. The substrate processing to be described later is executed by the controller 3 controlling these constituent elements. In other words, the controller 3 is programmed to execute steps of the substrate processing.

The controller 3 monitors luminance values of the images acquired by the image acquiring unit 100, and detects a time point at which a predetermined change occurs in the luminance value of the image acquired by the image acquiring unit 100 as a processing end time point FT. In detail, each time an image data ID is received from the image acquiring unit 100, the controller 3 extracts the luminance value from the image and stores in the memory 3B as luminance value information 120 including the luminance value and time information. The time information may be an internal time of the image acquiring unit 100. The controller 3 monitors a change over time in the luminance value extracted from the image. The processing end time point FT is a time point based on a start time point of monitoring of the luminance value, and a time from the start time point to the processing end time point FT matches an elapsed time (monitoring time) when the predetermined change occurs in the luminance value of the image.

A storage portion 3C constituted of a storage device such as a non-volatile memory is electrically connected to the controller 3. The image data ID, the recipe R, and the processing end time point FT, etc., are stored in the storage portion 3C. The processing end time point FT is stored for each production lot of the substrate W.

The controller 3 is electrically connected to a notifying unit 105 that notifies where an abnormality occurs during execution of the substrate processing. The notifying unit 105 is, for example, an alarm device that issues an alarm by using one or more of light, sound, text, and graphics. The notifying unit 105 may be a touch panel display.

<Details of Detection of Processing End Time Point>

Figure 4:
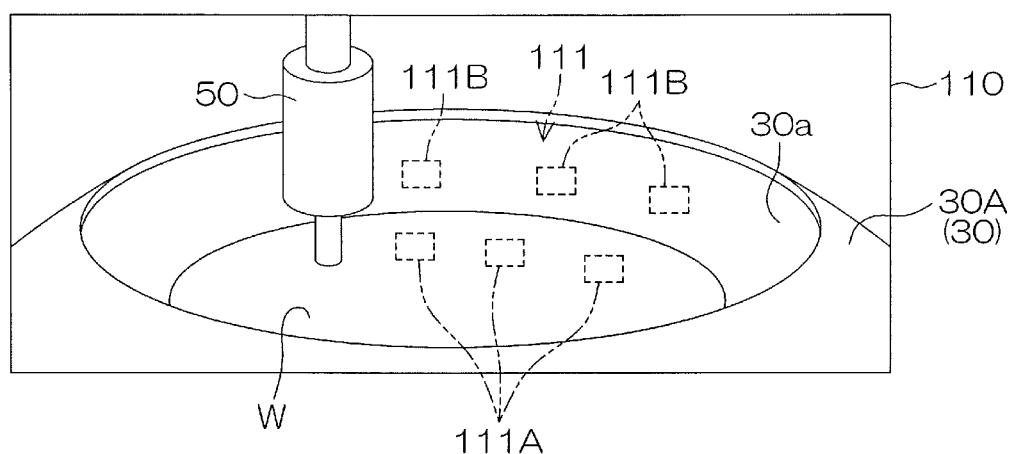
FIG. 4 is an example of image data acquired by an image acquiring unit provided in the processing unit.

FIG. 4 is an example of an image 110 acquired by the image acquiring unit 100. For convenience of description, the second guard 30B and the third guard 30C are not shown in FIG. 4.

The image 110 includes the images of at least a part of the upper surface of the substrate W and at least a part of the inner wall surface 30a of the first guard 30A. The image 110 includes a plurality of detected regions 111 whose luminance values are to be detected. The plurality of detected regions 111 include a plurality of first regions 111A set on the upper surface of the substrate W, and a plurality of second regions 111B set on the inner wall surface 30a of the first guard 30A. The plurality of first regions 111A are aligned at intervals in the circumferential direction of the upper surface of the substrate W in a peripheral edge region of the upper surface of the substrate W. The plurality of second regions 111B are aligned at intervals in the circumferential direction of the inner wall surface 30a of the first guard 30A. The peripheral edge region of the upper surface of the substrate W is a region including a peripheral edge of the upper surface of the substrate W and the circumference of the peripheral edge.

Figure 5A:
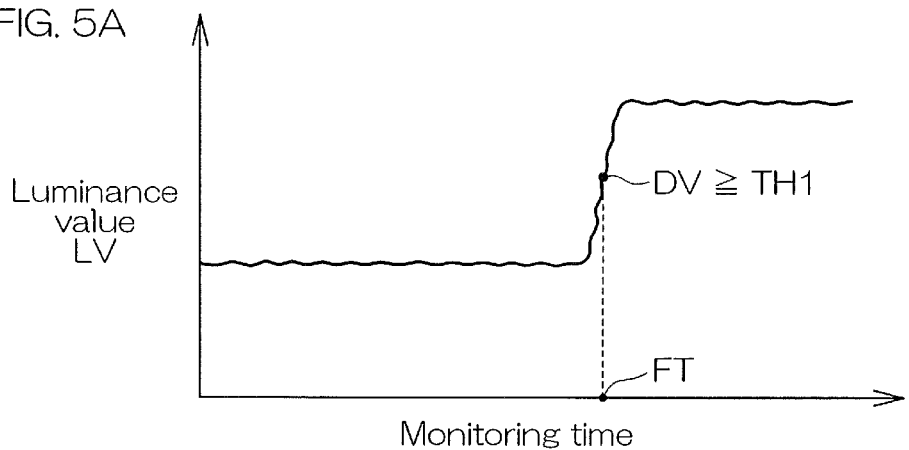
FIG. 5A is a graph showing an example of a change over time in a luminance value in a detected region of the image data.
Figure 5B:
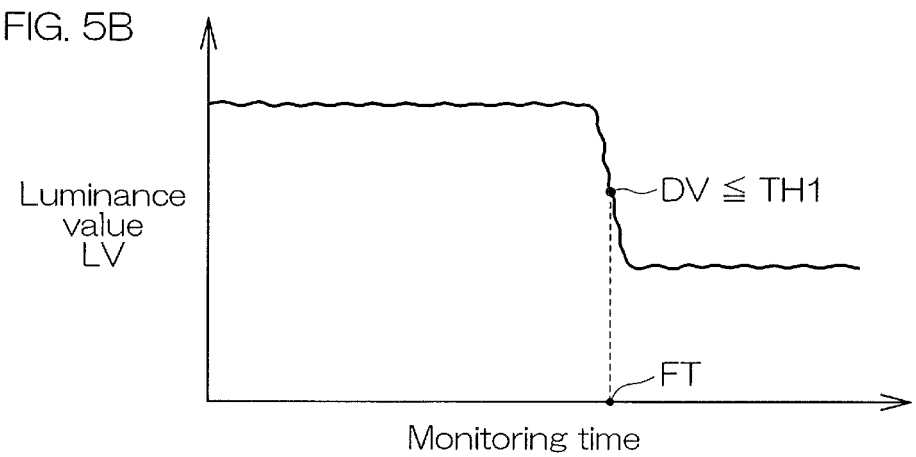
FIG. 5B is a graph showing an example of the change over time in the luminance value in the detected region.
Figure 5C:
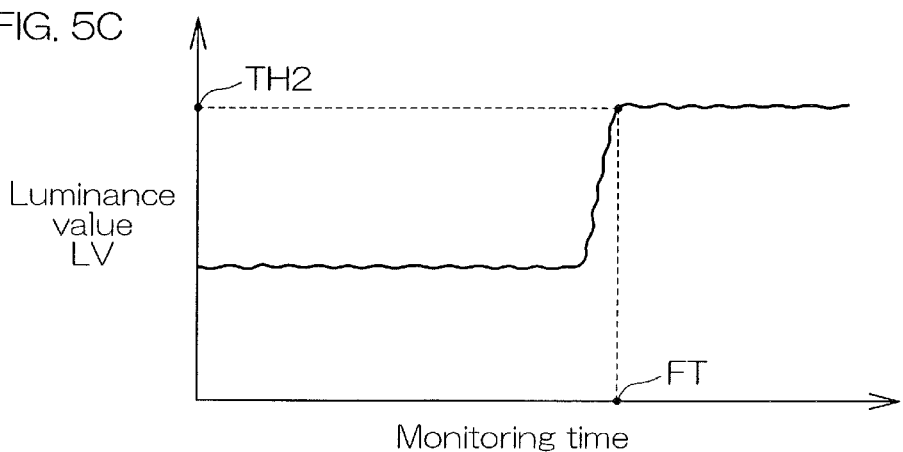
FIG. 5C is a graph showing an example of the change over time in the luminance value in the detected region.

FIGS. 5A to 5C are graphs showing examples of a change over time in a luminance value LV in each of the detected regions 111 included in the image 110. The predetermined change occurring in the luminance value LV which is a basis of detection of the processing end time point FT is that the luminance value LV is suddenly changed so that a differential value DV of the luminance value LV becomes not less than or not more than a predetermined threshold value, or that the luminance value LV becomes not less than or not more than a predetermined threshold value.

For example, the predetermined change in the luminance value LV is that a change amount of the luminance value LV (differential value DV of the luminance value LV) per unit time becomes a positive value which is not less than a predetermined threshold value TH1 (DV≥TH1>0) as shown in FIG. 5A.

The predetermined change in the luminance value LV may be, for example, that the change amount of the luminance value LV (differential value DV of the luminance value LV) per unit time becomes a negative value which is not more than the predetermined threshold value TH1 (DV≤TH1<0) as shown in FIG. 5B.

The mode in which the luminance value LV changes depends on the type of the resist film. The threshold value TH1 of the differential value DV of the luminance value LV of the detected region 111 is set as either a positive value or a negative value depending on a magnitude relationship between the luminance value LV of the detected region 111 when the resist film is being removed, and the luminance value LV of the detected region 111 after the resist film is removed. In a case where the luminance value LV of the detected region 111 when the resist film is being removed is lower than the luminance value LV of the detected region 111 after the resist film is removed (see FIG. 5A), the threshold value TH1 is set as a positive value. In a case where the luminance value LV of the detected region 111 when the resist film is being removed is higher than the luminance value LV of the detected region 111 after the resist film is removed (see FIG. 5B), the threshold value TH1 is set as a negative value.

The predetermined change in the luminance value LV may be that the luminance value LV becomes a value not less than a predetermined threshold value TH2 (LV≥TH2) as shown in FIG. 5C. Although not shown, the predetermined change in the luminance value LV may be that the luminance value LV becomes a value not more than the predetermined threshold value TH2.

It may be determined whether or not the predetermined change occurs in the luminance value LV by using both a magnitude relationship between the threshold value TH2 and the luminance value LV and a magnitude relationship between the differential value DV and the threshold value TH1. In addition, the condition that the luminance value or the differential value of the luminance value becomes not less than or not more than the threshold value is not always required, but a condition that the luminance value or the differential value of the luminance value is larger than the threshold value, or a condition that the luminance value or the differential value of the luminance value is smaller than the threshold value may be adopted.

<Example of Substrate Processing>

FIG. 6 is a flow chart for describing an example of the substrate processing to be executed by the substrate processing apparatus 1. FIG. 6 mainly shows the processing to be realized by the controller 3 executing a program.

In the substrate processing by the substrate processing apparatus 1, for example, as shown in FIG. 6, a substrate carry-in step (Step S1), a removal processing step (Step S2), a rinsing step (Step S3), a drying step (Step S4), and a substrate carry-out step (Step S5) are executed in this order. During execution of the removal processing step, an image acquiring step (Step S6) of acquiring the images of the upper surface of the substrate W and the inner wall surface 30*a* of the first guard 30A is executed.

Figure 8A:
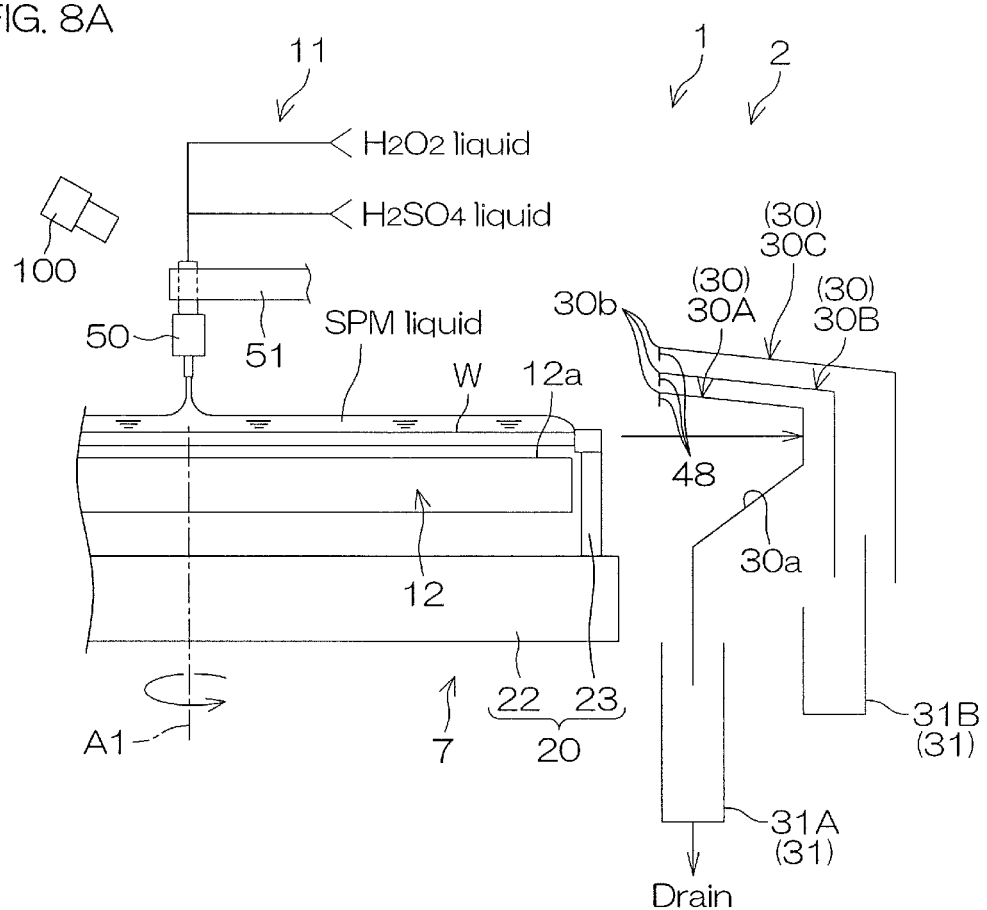
FIG. 8A is a schematic view for describing a state of a removal processing step in the substrate processing.
Figure 8B:
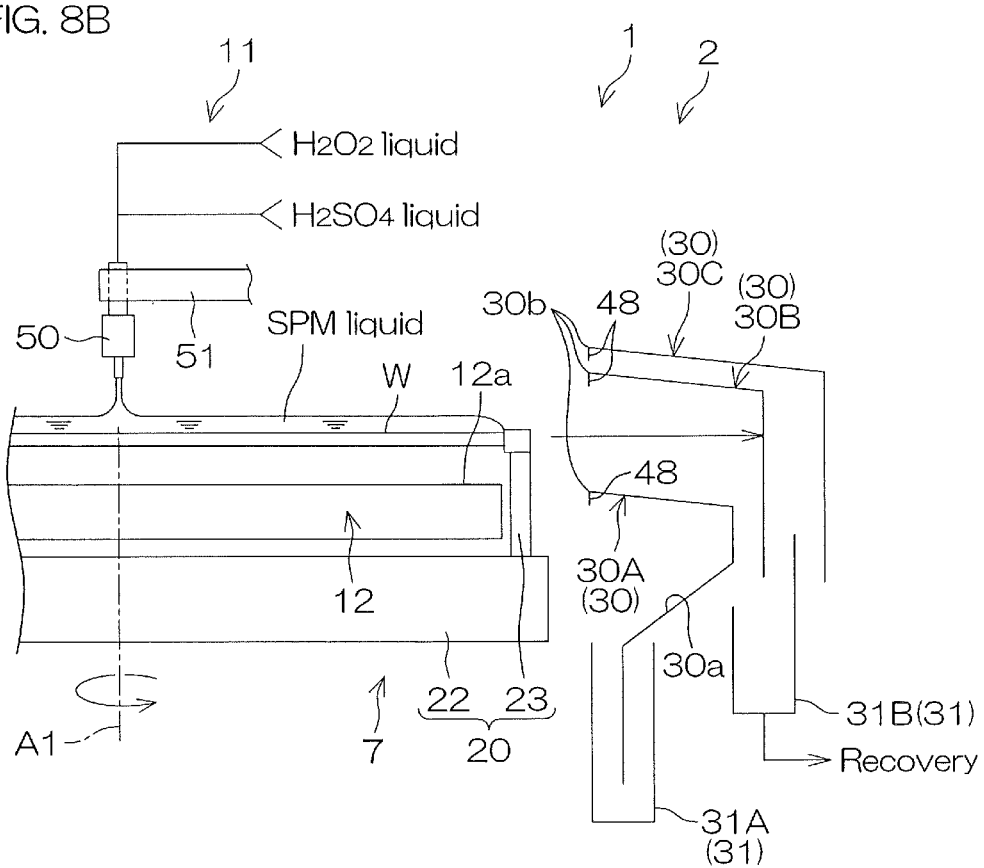
FIG. 8B is a schematic view for describing a state of the removal processing step.
Figure 8C:
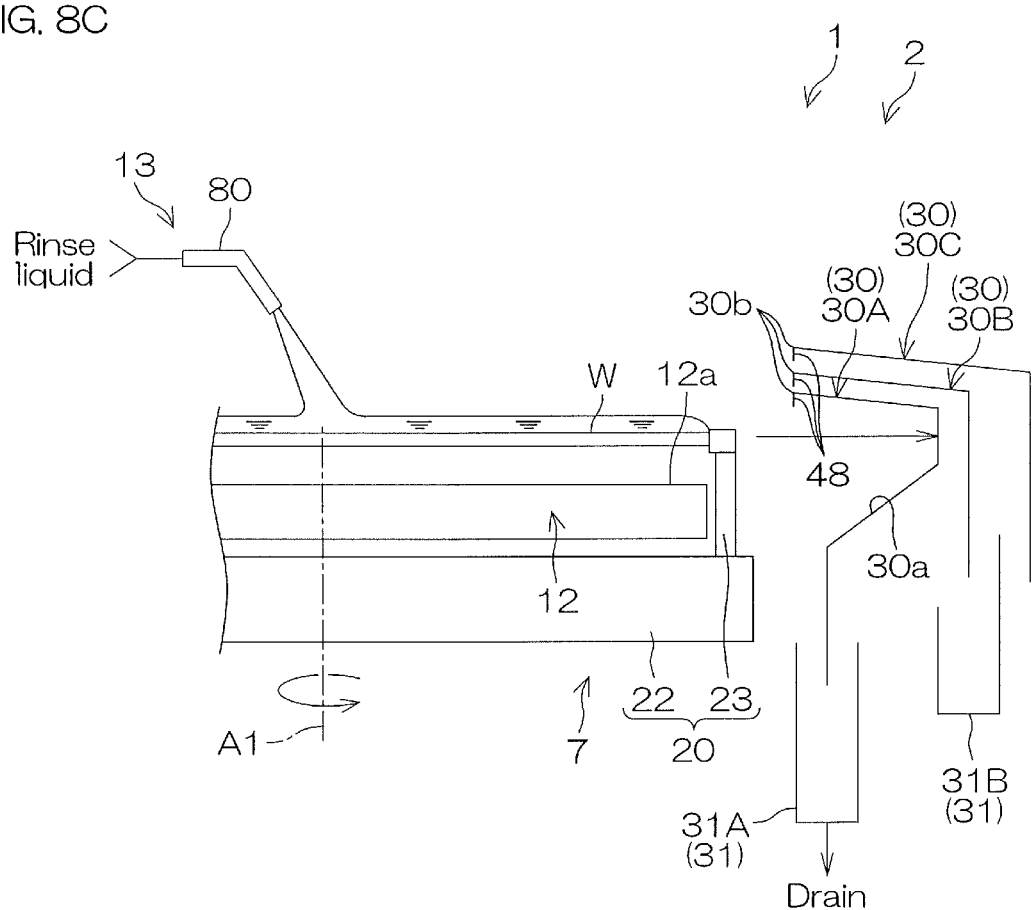
FIG. 8C is a schematic view for describing a state of the removal processing step.

FIG. 7 is a time chart regarding major actions in the substrate processing. FIG. 7 shows a time chart regarding whether or not the SPM liquid is ejected, whether or not the rinse liquid is ejected, a discharge destination of the remover liquid, and a position of the heater unit 12 (heater position). FIGS. 8A to 8C are schematic views for describing states of the steps of the substrate processing to be executed by the substrate processing apparatus 1.

Hereinafter, the substrate processing to be executed by the substrate processing apparatus 1 will be described mainly with reference to FIGS. 2, 6, and 7. FIGS. 8A to 8C will be referred appropriately.

First, an unprocessed substrate W is carried into the processing unit 2 from the carrier C by the transfer robots IR, CR (see FIG. 1), and passed over to the substrate holding unit 20 of the spin chuck 7 (substrate carry-in step: Step S1). The substrate W is thereby horizontally held by the substrate holding unit 20 in a posture that the device surface (surface to be processed) where the resist film is formed faces upward (substrate holding step). Holding of the substrate W by the substrate holding unit 20 is continued until the drying step (Step S4) is ended.

In the substrate processing, electric power is always supplied to the heater 91 of the heater unit 12. At the time of carrying the substrate in, the heater unit 12 is disposed at the separating position.

In a state where the substrate W is held by the substrate holding unit 20, the substrate rotating unit 21 starts rotation of the substrate W (substrate rotating step) In the substrate processing, the first pump 64 and the heating unit 63 are always operated. In the substrate processing, the drain valve 39 is closed and the recovery valve 38 is opened.

Next, after the transfer robot CR is retreated out of the processing unit 2, the removal processing step (Step S2) of processing the upper surface of the substrate W with the remover liquid is executed.

Specifically, the nozzle moving unit 52 moves the remover liquid nozzle 50 to a processing position. The processing position of the remover liquid nozzle 50 is, for example, the central position. The guard raising/lowering unit 33 switches the disposition of the plurality of guards 30 from the carry-in/carry-out disposition to the first liquid receiving disposition. The heater raising/lowering unit 95 disposes the heater unit 12 at the proximity position.

In a state where the remover liquid nozzle 50 is placed at the processing position, the plurality of guards 30 are disposed in the first liquid receiving disposition, and the heater unit 12 is disposed at the proximity position, the sulfuric acid aqueous solution valve 56 and the hydrogen peroxide solution valve 71 are opened. Thereby, as shown in FIG. 8A, the SPM liquid serving as the remover liquid is supplied (ejected) from the remover liquid nozzle 50 toward the central region of the upper surface of the substrate W being rotated about the rotation axis A1 (remover liquid supplying step, processing liquid supplying step).

The SPM liquid landing on the central region of the upper surface of the substrate W receives centrifugal force caused by the rotation of the substrate W and spreads radially over the entire upper surface of the substrate W. The entire upper surface of the substrate W is thereby processed with the SPM liquid. The SPM liquid landing on the upper surface of the substrate W is heated by the heater unit 12 via the substrate W (heating step). By heating the SPM liquid, the processing of the upper surface of the substrate W with the SPM liquid is facilitated.

The SPM liquid reaching the peripheral edge of the upper surface of the substrate W is discharged from the peripheral edge of the upper surface of the substrate W by the centrifugal force. The SPM liquid discharged from the upper surface of the substrate W is received by the first guard 30A. The SPM liquid received by the first guard 30A is discharged to the first drain piping 34 (drain flow passage) (draining step).

At the same time as start of ejection of the SPM liquid from the remover liquid nozzle 50, acquisition of the images of the upper surface of the substrate W and the inner wall surface 30*a* of the first guard 30A by the image acquiring unit 100 is started (image acquiring step: Step S6). When the image data ID is received from the image acquiring unit 100, the controller 3 executes end time point detection processing for detecting the processing end time point FT. Details of the end time point detection processing will be described later.

When the controller 3 detects the processing end time point FT, the image acquiring unit 100 ends the acquisition of the images at the same time as detection of the processing end time point FT. As shown in FIG. 8B, even after the monitoring time of the luminance value reaches the processing end time point FT, supply of the remover liquid to the upper surface of the substrate W is maintained (remover liquid supply maintaining step, processing liquid supply maintaining step). Meanwhile, at the same time as the detection of the processing end time point FT by the controller 3, the heater raising/lowering unit 95 moves the heater unit 12 to the separating position. Thereby, while maintaining the supply of the remover liquid to the upper surface of the substrate W, heating applied to the SPM liquid on the upper surface of the substrate W is stopped (heating stopping step). There is no need for completely stopping the heating applied to the substrate W by the heater unit 12 but the heating applied to the substrate W by the heater unit 12 is only required to be weakened (heating weakening step).

At the same time as the detection of the processing end time point FT by the controller 3, the disposition of the plurality of guards 30 is switched from the first liquid receiving disposition to the second liquid receiving disposition by the guard raising/lowering unit 33. Thereby, as shown in FIG. 8B, the guard 30 that receives the SPM liquid discharged from the substrate W is switched to the second guard 30B. The SPM liquid received by the second guard 30B is discharged to the recovery piping 36 (recovery flow passage) via the common piping 35. That is, in a case where the processing end time point FT is detected, the discharge destination of the SPM liquid (processing liquid, remover liquid) scattered from the substrate W is switched from the first drain piping 34 (drain flow passage) to the recovery piping 36 (recovery flow passage) (flow passage switching step).

In such a way, in the substrate processing, the guard raising/lowering unit 33 functions as a flow passage switching unit that switches the discharge destination of the SPM liquid (processing liquid, remover liquid) scattered from the substrate W from the first drain piping 34 to the recovery piping 36 by switching the disposition of the plurality of guards 30 to any of the first liquid receiving disposition and the second liquid receiving disposition.

When a predetermined cooling time CT (see FIG. 7) elapses after a time point at which the heating applied to the SPM liquid on the substrate W by the heater unit 12 is stopped, the rinsing step (Step S3) of washing away the SPM liquid on the upper surface of the substrate W is started.

The rinsing step (Step S3) may be started based on a time point at which the disposition of the plurality of guards 30 is switched to the second liquid receiving disposition. That is, the rinsing step may be started when a predetermined recovery time RT (see FIG. 7) elapses after the time point at which the disposition of the plurality of guards 30 is switched to the second liquid receiving disposition. In the preferred embodiment, the heating applied to the SPM liquid on the substrate W is stopped and the disposition of the plurality of guards 30 is switched at the processing end time point FT. Thus, the cooling time CT and the recovery time RT are the same length of time.

Specifically, the sulfuric acid aqueous solution valve 56 and the hydrogen peroxide solution valve 71 are closed. Supply of the SPM liquid to the upper surface of the substrate W is thereby stopped (remover liquid supply stopping step, processing liquid supply stopping step). After the sulfuric acid aqueous solution valve 56 and the hydrogen peroxide solution valve 71 are closed, the nozzle moving unit 52 moves the remover liquid nozzle 50 to the retreat position. Then, the guard raising/lowering unit 33 switches the disposition of the plurality of guards 30 from the second liquid receiving disposition to the first liquid receiving position.

In a state where the supply of the SPM liquid to the upper surface of the substrate W is stopped and the plurality of guards 30 are disposed in the first liquid receiving position, the rinse liquid valve 82 is opened. Thereby, as shown in FIG. 8C, the rinse liquid is supplied (ejected) from the rinse liquid nozzle 80 toward the central region of the upper surface of the substrate W (rinse supplying step). The rinse liquid landing on the central region of the upper surface of the substrate W receives the centrifugal force caused by the rotation of the substrate W and spreads radially over the entire upper surface of the substrate W. The rinse liquid supplying step is performed in a state where the supply of the remover liquid to the upper surface of the substrate W is stopped after the heating stopping step (heating weakening step).

The rinse liquid is discharged from the peripheral edge of the upper surface of the substrate W by the centrifugal force. The SPM liquid adhering to the upper surface of the substrate W is thereby washed away with the rinse liquid. The rinse liquid valve 82, the sulfuric acid aqueous solution valve 56, and the hydrogen peroxide solution valve 71 are examples of a liquid switching unit that switches the liquid to be supplied to the upper surface of the substrate W from the SPM liquid (remover liquid, processing liquid) to the rinse liquid after the processing end time point FT.

The rinse liquid and the SPM liquid discharged from the upper surface of the substrate W are received by the first guard 30A. The rinse liquid and the SPM liquid received by the first guard 30A are discharged to the first drain piping 34 (drain flow passage) (draining step).

After supply of the rinse liquid to the upper surface of the substrate W is continued for a predetermined rinsing time, the drying step (Step S4) of drying the upper surface of the substrate W is executed.

Specifically, the rinse liquid valve 82 is closed, and the supply of the rinse liquid from the rinse liquid nozzle 80 is stopped. By the guard raising/lowering unit 33, the disposition of the plurality of guards 30 is switched from the first liquid receiving disposition to the third liquid receiving disposition, and the liquid scattered from the substrate W is received by the third guard 30C.

In the drying step (Step S4), in a state where the rinse liquid valve 82 is closed and the plurality of guards 30 are disposed in the third liquid receiving position, the spin motor 25 rotates the substrate W at high speed (for example, 2,000 rpm). Large centrifugal force is thereby applied to the rinse liquid on the substrate W, and the rinse liquid on the substrate W is spun off to the circumference of the substrate W.

After high-speed rotation of the substrate W is continued for a predetermined drying time, the spin motor 25 stops the rotation of the substrate W. In a state where the rotation of the substrate W is stopped, the guard raising/lowering unit 33 moves the plurality of guards 30 to the carry-in/carry-out position.

The transfer robot CR enters the processing unit 2, lifts up the processed substrate W from the chuck pins 23 of the substrate holding unit 20, and carries the substrate W out of the processing unit 2 (substrate carry-out step: Step S5). The substrate W is passed over from the transfer robot CR to the transfer robot IR, and housed in the carrier C by the transfer robot IR.

<Details of End Time Point Detection Processing>

FIG. 9 is a flow chart showing a flow of a first example of the end time point detection processing. First, the controller 3 monitors whether or not reception of the image data ID from the image acquiring unit 100 is started (Step S11). In a case where the reception of the image data ID is not started (Step S11: NO), the controller 3 returns to Step S11. In a case where the reception of the image data ID is started (Step S11: YES), the controller 3 starts the monitoring of the luminance value of the image 110 included in the image data ID (Step S12: luminance value monitoring step).

After that, the controller 3 determines whether or not the predetermined change occurs in the luminance value of the image 110. Specifically, the controller 3 determines whether or not the predetermined change occurs in any one of the luminance value of the image of the upper surface of the substrate W (substrate luminance value) and the luminance value of the image of the inner wall surface 30a of the first guard 30A (guard luminance value) (Step S13: determining step).

In detail, in a case where the predetermined change occurs in the luminance values of all the first regions 111A, the controller 3 determines that the predetermined change occurs in the luminance value of the image of the upper surface of the substrate W in the determining step (Step S13). In a case where the predetermined change occurs in the luminance values of a part of the first regions 111A, the controller 3 determines that the predetermined change does not occur in the luminance value of the image of the upper surface of the substrate W.

Similarly, in a case where the predetermined change occurs in the luminance values of all the second regions 111B, the controller 3 determines that the predetermined change occurs in the luminance value of the inner wall surface 30a of the first guard 30A in the determining step (Step S13). In a case where the predetermined change occurs in the luminance values of a part of the second regions 111B, the controller 3 determines that the predetermined change does not occur in the luminance value of the inner wall surface 30a of the first guard 30A.

In the determining step (Step S13), in a case where the predetermined change does not occur in both the substrate luminance value and the guard luminance value (Step S13: NO), the controller 3 returns to Step S13. In a case where the predetermined change occurs in any one of the substrate luminance value and the guard luminance value (Step S13: YES), the controller 3 detects, as the processing end time point FT, a time point at which the predetermined change occurs in any one of the substrate luminance value and the guard luminance value (Step S14: detecting step). The controller 3 is an example of a detecting unit. After Step S14, the controller 3 ends the end time point detection processing.

According to the first preferred embodiment, the remover liquid supplied to the upper surface (surface to be processed) of the substrate W is received by the cylindrical first guard 30A that surrounds the substrate W. While the remover liquid is supplied to the upper surface of the substrate W, the images of both the upper surface of the substrate W and the inner wall surface 30a of the first guard 30A are acquired, and the luminance values of the acquired images are monitored. Therefore, it is possible to detect the processing end time point FT based on both the substrate luminance value and the guard luminance value.

There is sometimes a case where the predetermined change in the luminance value occurs only in any one of the upper surface of the substrate W and the inner wall surface 30a of the first guard 30A. For example, in a case where the resist composition that constitutes the resist film which is formed on the device surface of the substrate W is KrF (chemically-amplified resist composition/polyhydroxystyrene resin), a thickness of the resist film is several tens of nm, and the resist film is an extremely thin hardened layer. Therefore, the entire amount of the resist film formed on the substrate W is relatively small, and an amount of the resist composition to be dissolved with the SPM liquid is relatively low. Since a concentration of the resist composition in the SPM liquid scattered from the upper surface of the substrate W is relatively low, a change amount of the luminance value of the image of the inner wall surface 30a of the first guard 30A is small. Meanwhile, a color of a part where the resist film is removed from the upper surface of the substrate W is changed to a color of a substance exposed by peeling of the resist film. Thus, a change amount of the luminance value of the image of the upper surface of the substrate W is large. Therefore, in a case where the resist film is KrF, the processing end time point FT is preferably detected based on the luminance value of the image of the upper surface of the substrate W.

In a case where the resist composition that constitutes the resist film which is formed on the device surface of the substrate W is I-lin (diazo resin, etc.), the resist film is not a hardened layer and the thickness of the resist film is as relatively thick as 3 μm to 5 μm. Therefore, the entire amount of the resist film formed on the substrate W is relatively large, and the amount of the resist composition to be dissolved with the SPM liquid is relatively high. Thus, the change amount of the luminance value of the image of the inner wall surface 30a of the first guard 30A is larger than the change amount of the luminance value of the image of the upper surface of the substrate W.

Therefore, with the arrangement in which the luminance values of the image of the upper surface of the substrate W and the image of the inner wall surface 30a of the first guard 30A are monitored and the processing end time point FT is detected, in comparison to an arrangement in which only one of the substrate luminance value and the guard luminance value is monitored, it is possible to favorably detect an end of the processing of the upper surface of the substrate W. In particular, by detecting, as the processing end time point FT, the time point at which the predetermined change occurs in any one of the substrate luminance value and the guard luminance value, even in a case where any of a change in the substrate luminance value and a change in the guard luminance value is not sufficient at the processing end time point FT, it is possible to promptly detect the end of the processing of the upper surface of the substrate W.

In addition, according to the first preferred embodiment, the rinse liquid is not supplied to the upper surface of the substrate W at the same time as the end of the processing of the upper surface of the substrate W but the rinse liquid is supplied to the upper surface of the substrate W after the heating applied to the substrate W is weakened (stopped). That is, the rinse liquid is supplied to the upper surface of the substrate W after the temperature of the substrate W is lowered by weakening (stopping) the heating applied to the substrate W. Therefore, it is possible to ease a sudden decrease in the substrate temperature due to the supply of the rinse liquid to the substrate W. While favorably detecting the end of the processing of the upper surface of the substrate W with the processing liquid, it is possible to smoothly wash away the processing liquid with the rinse liquid.

In addition, according to the first preferred embodiment, in a case where the processing end time point FT is detected, by changing the disposition of the plurality of guards 30, the discharge destination of the processing liquid scattered from the substrate W is switched from the first drain piping 34 to the recovery piping 36 (flow passage switching step).

Therefore, it is possible to switch the discharge destination of the remover liquid to the recovery piping 36 at an appropriate time point at which the processing of the upper surface of the substrate W (removal of the resist film) is ended. Thus, while favorably detecting the end of the processing of the upper surface of the substrate W, it is possible to recover the remover liquid supplied to the upper surface of the substrate W after the processing of the upper surface of the substrate W is ended, that is, the remover liquid whose cleanliness is relatively high.

When the processing end time point FT is stored for each production lot of the substrate W, it is possible to compare differences of the processing end time point FT according to the production lot.

Next, other examples (second to fourth examples) of the end time point detection processing will be described.

<Second Example of End Time Point Detection Processing>

Figure 10:
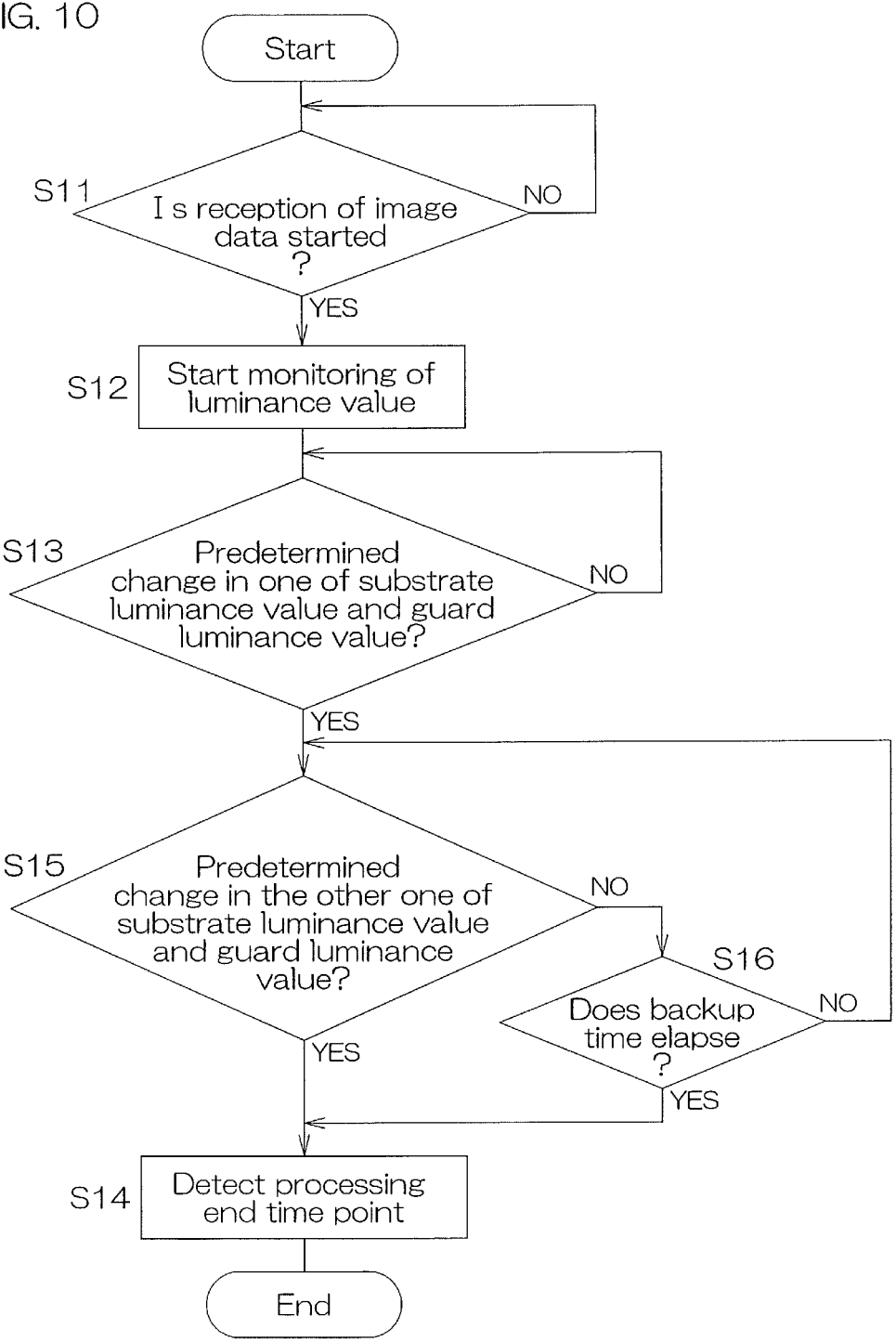
FIG. 10 is a flow chart showing a flow of a second example of the end time point detection processing.

FIG. 10 is a flow chart showing a flow of a second example of the end time point detection processing.

First, in the second example of the end time point detection processing, the controller 3 monitors whether or not the reception of the image data ID from the image acquiring unit 100 is started (Step S11). In a case where the reception of the image data ID is not started (Step S11: NO), the controller 3 returns to Step S11. In a case where the reception of the image data ID is started (Step S11: YES), the controller 3 starts the monitoring of the luminance value of the image 110 in the image data ID (Step S12: luminance value monitoring step).

After that, the controller 3 determines whether or not the predetermined change occurs in the luminance value of the image 110. Specifically, the controller 3 determines whether or not the predetermined change occurs in any one of the substrate luminance value and the guard luminance value (Step S13: first determining step).

In the first determining step (Step S13), in a case where the predetermined change does not occur in any one of the substrate luminance value and the guard luminance value (Step S13: NO), the controller 3 returns to the first determining step (Step S13). In the first determining step, in a case where the predetermined change occurs in any one of the substrate luminance value and the guard luminance value (Step S13: YES), the controller 3 determines whether or not the predetermined change occurs in the other one of the substrate luminance value and the guard luminance value (Step S15: second determining step).

In the second determining step (Step S15), in a case where the predetermined change occurs in the other one of the substrate luminance value and the guard luminance value (Step S15: YES), the controller 3 detects, as the processing end time point FT, a time point at which the predetermined change occurs in the other one of the substrate luminance value and the guard luminance value, that is, the time point at which the predetermined change occurs in the substrate luminance value or the time point at which the predetermined change occurs in the guard luminance value, whichever is later (Step S14: detecting step). The controller 3 is an example of the detecting unit. After the detecting step (Step S14), the controller 3 ends the end time point detection processing.

In the second determining step (Step S15), in a case where the predetermined change does not occur in the other one of the substrate luminance value and the guard luminance value (Step S15: NO), the controller 3 monitors whether or not a backup time elapses until the backup time elapses (Step S16: backup time monitoring step).

In the backup time monitoring step (Step S16), in a case where the backup time does not elapse (Step S16: NO), the controller 3 returns to Step S15. In the backup time monitoring step (Step S16), in a case where the backup time elapses (Step S16: YES), the time point at which the predetermined change occurs in any one of the substrate luminance value and the guard luminance value is detected as the processing end time point FT (Step S14: detecting step). In such a way, in a case where the predetermined change occurs in any one of the substrate luminance value and the guard luminance value before a notification time elapses after a start time point of the monitoring of the luminance value, irrespective of whether or not the predetermined change occurs in the other one of the substrate luminance value and the guard luminance value, the processing end time point FT is detected. After the detecting step (Step S14), the controller 3 ends the end time point detection processing.

Even in a case where the processing of the upper surface of the substrate W sufficiently progresses and the predetermined change occurs in the substrate luminance value, there is sometimes a case where a residue generated by the processing of the upper surface of the substrate W adheres to the inner wall surface 30a of the first guard 30A and there is a need for continuing the supply of the remover liquid to remove the residue from the inner wall surface 30a of the first guard 30A. On the other hand, there is sometimes a case where the processing of the entire upper surface of the substrate W has not ended yet but due to a progress of processing of a part of the upper surface of the substrate W, the predetermined change occurs in the guard luminance value.

However, in the second example of the end time point detection processing, the time point at which, after the predetermined change occurs in one of the substrate luminance value and the guard luminance value, the predetermined change occurs in the other one of the substrate luminance value and the guard luminance value, or the time point at which the predetermined backup time elapses after the time point at which the predetermined change occurs in one of the substrate luminance value and the guard luminance value, whichever is earlier, is detected as the processing end time point FT. Therefore, it is possible to promptly detect a time point at which the resist film is sufficiently removed from the upper surface of the substrate W and the residue of the resist film adhering to the inner wall surface 30a of the first guard 30A is sufficiently removed.

<Third Example of End Time Point Detection Processing>

Figure 11:
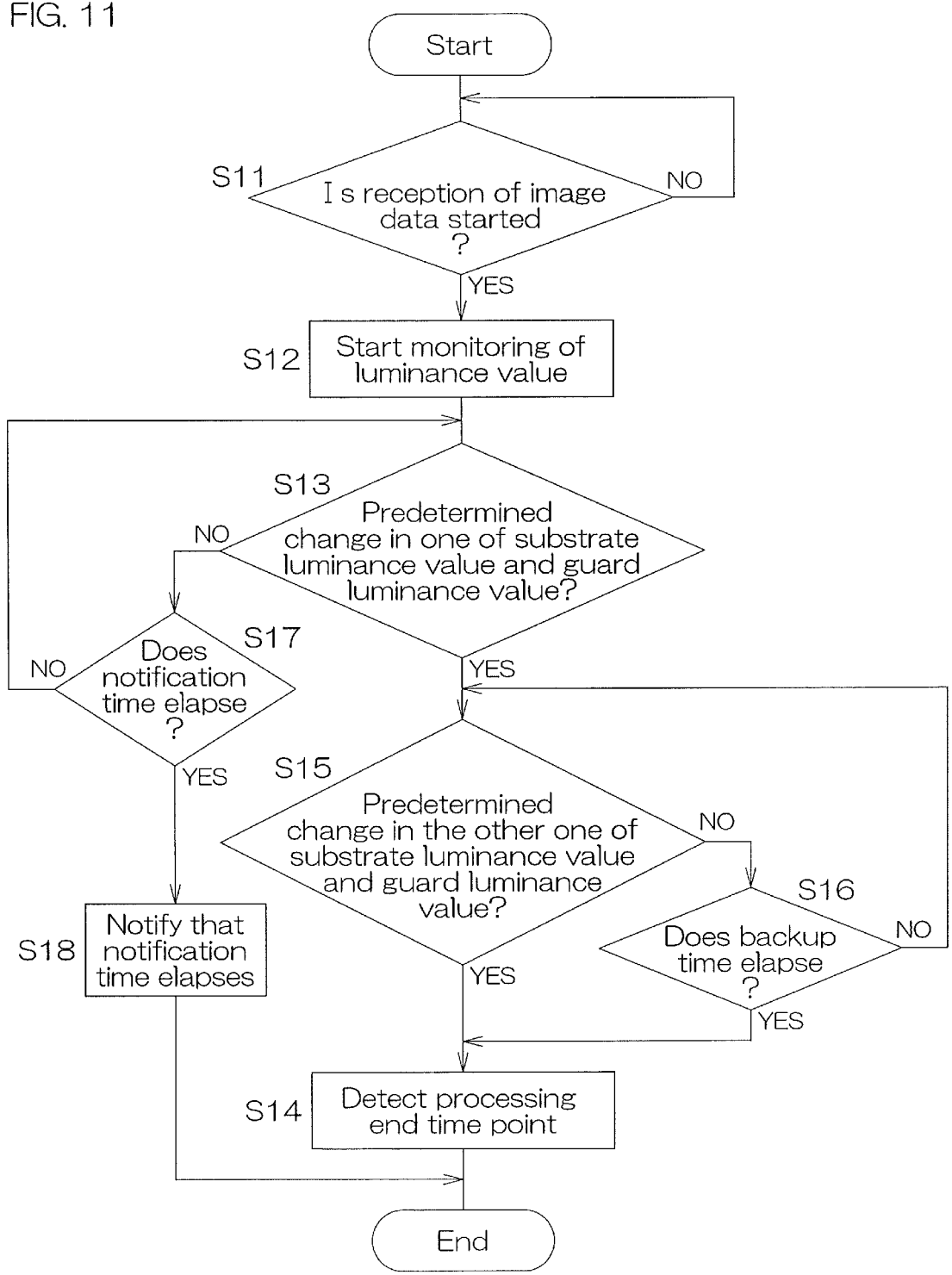
FIG. 11 is a flow chart showing a flow of a third example of the end time point detection processing.

FIG. 11 is a flow chart showing a flow of a third example of the end time point detection processing. In the third example of the end time point detection processing, unlike the second example of the end time point detection processing, in a case where a predetermined notification time elapses after a start time point of the monitoring of the luminance value, notification is made to that effect.

The notification time is, for example, a time calculated based on the processing end time point FT of the processed substrate W stored in the storage portion 3C. More specifically, the notification time is a time determined by adding a predetermined additional time (such as 10 seconds) to a time from the start time point of the monitoring of the luminance value to the processing end time point FT (such as 30 seconds) in the substrate processing of the last substrate W processed in same processing unit 2. The notification time may be a time determined by adding an additional time, which is determined by multiplying a time from the start time point of the monitoring of the luminance value to the processing end time point FT in the substrate processing of the last substrate W processed in same processing unit 2 by a predetermined ratio (such as 30%), to the time described above.

First, in the third example of the end time point detection processing, the controller 3 monitors whether or not the reception of the image data ID from the image acquiring unit 100 is started (Step S11). In a case where the reception of the image data ID is not started (Step S11: NO), the controller 3 returns to Step S11. In a case where the reception of the image data ID is started (Step S11: YES), the controller 3 starts the monitoring of the luminance value of the image 110 in the image data ID (Step S12: luminance value monitoring step).

After that, the controller 3 determines whether or not the predetermined change occurs in the luminance value of the image 110. Specifically, the controller 3 determines whether or not the predetermined change occurs in any one of the substrate luminance value and the guard luminance value (Step S13: first determining step).

In the first determining step (Step S13), in a case where the predetermined change does not occur in any one of the substrate luminance value and the guard luminance value (Step S13: NO), the controller 3 monitors whether or not the notification time elapses after the start time point of the monitoring of the luminance value (Step S17: notification time monitoring step).

In the notification time monitoring step (Step S17), in a case where the notification time does not elapse (Step S17: NO), the controller 3 returns to the first determining step (Step S13). In the notification time monitoring step (Step S17), in a case where the notification time elapses after the start time point of the monitoring of the luminance value (Step S17: YES), the controller 3 makes the notifying unit 105 notify that the notification time elapses (Step S18: notifying step). After the notifying step (Step S18), the controller 3 ends the end time point detection processing without detecting the processing end time point FT.

In a case where the predetermined change occurs in any one of the substrate luminance value and the guard luminance value before the notification time elapses after the start time point of the monitoring of the luminance value (Step S13: YES), the controller 3 determines whether or not the predetermined change occurs in the other one of the substrate luminance value and the guard luminance value (Step S15: second determining step).

In the second determining step (Step S15), in a case where the predetermined change occurs in the other one of the substrate luminance value and the guard luminance value (Step S15: YES), a time point at which the predetermined change occurs in the other one of the substrate luminance value and the guard luminance value, that is, the time point at which the predetermined change occurs in the substrate luminance value or the time point at which the predetermined change occurs in the guard luminance value, whichever is later, is detected as the processing end time point FT (Step S14: detecting step). After Step S14, the controller 3 ends the end time point detection processing.

In the second determining step (Step S15), in a case where the predetermined change does not occur in the other one of the substrate luminance value and the guard luminance value (Step S15: NO), the controller 3 monitors whether or not the backup time elapses after the time point at which the predetermined change occurs (Step S16: backup time monitoring step).

In the backup time monitoring step (Step S16), in a case where the backup time does not elapse (Step S16: NO), the controller 3 returns to the second determining step (Step S15). In the backup time monitoring step (Step S16), in a case where the backup time elapses (Step S16: YES), the time point at which the predetermined change occurs in any one of the substrate luminance value and the guard luminance value is detected as the processing end time point FT (Step S14: detecting step). In such a way, in a case where the predetermined change occurs in any one of the substrate luminance value and the guard luminance value before the notification time elapses after the start time point of the monitoring of the luminance value, irrespective of whether or not the predetermined change occurs in the other one of the substrate luminance value and the guard luminance value, the processing end time point FT is detected. After the detecting step (Step S14), the controller 3 ends the end time point detection processing.

In the third example of the end time point detection processing, the time point at which, after the predetermined change occurs in one of the substrate luminance value and the guard luminance value, the predetermined change occurs in the other one of the substrate luminance value and the guard luminance value, or the time point at which the predetermined backup time elapses after the time point at which the predetermined change occurs in one of the substrate luminance value and the guard luminance value, whichever is earlier, is detected as the processing end time point FT. Therefore, it is possible to promptly detect the time point at which the resist film is sufficiently removed from the upper surface of the substrate W and the residue of the resist film adhering to the inner wall surface 30a of the first guard 30A is sufficiently removed.

In the third example of the end time point detection processing, further, in a case where the processing end time point FT is not detected within the predetermined notification time after the start time point of the monitoring of the luminance value, notification is made to the effect that the processing end time point FT is not detected (notifying step).

Therefore, it is possible to promptly notify that the processing end time point FT is not detected due to a detection abnormality. By stopping the substrate processing in accordance with the notification, it is possible to suppress consumption of the processing liquid at the time of the detection abnormality.

In addition, by calculating the notification time based on the processing end time point FT of the processed substrate W stored in the storage portion 3C, it is possible to optimize the notification time.

<Fourth Example of End Time Point Detection Processing>

Figure 12:
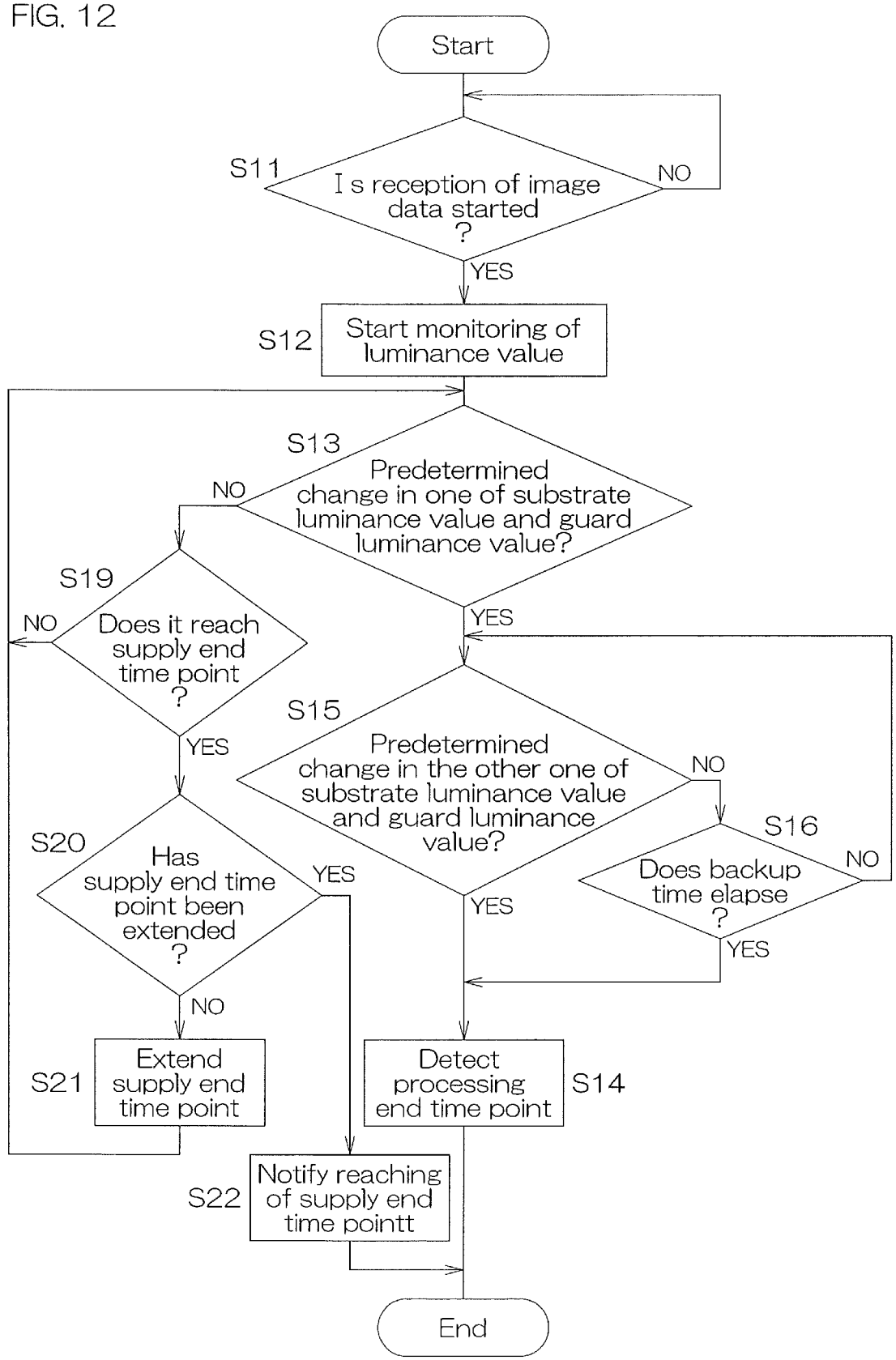
FIG. 12 is a flow chart showing a flow of a fourth example of the end time point detection processing.

FIG. 12 is a flow chart showing a flow of a fourth example of the end time point detection processing. In the fourth example of the end time point detection processing, unlike the third example of the end time point detection processing, in a case where the processing end time point FT is not detected before a supply end time point at which the supply of the remover liquid to the upper surface of the substrate W is scheduled to end, the controller 3 extends the supply end time point. The controller 3 is an example of a supply end time point extending unit. The supply end time point is set for each recipe R.

The supply end time point is a time point based on the start time point of the monitoring of the luminance value. Matching of the monitoring time with a time between the start time point and the supply end time point is expressed as the monitoring time of the luminance value reaches the supply end time point.

First, in the fourth example of the end time point detection processing, the controller 3 monitors whether or not the reception of the image data ID from the image acquiring unit 100 is started (Step S11). In a case where the reception of the image data ID is not started (Step S11: NO), the controller 3 returns to Step S11. In a case where the reception of the image data ID is started (Step S11: YES), the controller 3 starts the monitoring of the luminance value of the image 110 in the image data ID (Step S12: luminance value monitoring step).

After that, the controller 3 determines whether or not the predetermined change occurs in the luminance value of the image 110. Specifically, the controller 3 determines whether or not the predetermined change occurs in any one of the substrate luminance value and the guard luminance value (Step S13: first determining step).

In the first determining step (Step S13), in a case where the predetermined change does not occur in any one of the substrate luminance value and the guard luminance value (Step S13: NO), the controller 3 monitors whether or not the monitoring time of the luminance value reaches the supply end time point (Step S19: supply end time point monitoring step).

In the supply end time point monitoring step (Step S19), in a case where the monitoring time of the luminance value does not reach the supply end time point (Step S19: NO), the controller 3 returns to the first determining step (Step S13). In the supply end time point monitoring step (Step S19), in a case where the monitoring time of the luminance value reaches the supply end time point (Step S19: YES), the controller 3 determines whether or not the supply end time point has been extended (Step S20). In a case where the supply end time point has never been extended (Step S20: NO), the controller 3 extends the supply end time point (Step S21: supply end time point extending step). After extending the supply end time point, the controller 3 returns to the first determining step (Step S13).

In a case where the supply end time point has been extended once (Step S20: YES), the controller 3 makes the notifying unit 105 notify that the supply end time point is passed (Step S22: notifying step). After the notifying step (Step S22), the controller 3 ends the end time point detection processing without detecting the processing end time point FT.

In a case where the predetermined change occurs in any one of the substrate luminance value and the guard luminance value before an extended time elapses after the start time point of the monitoring of the luminance value (Step S13: YES), the controller 3 determines whether or not the predetermined change occurs in the other one of the substrate luminance value and the guard luminance value (Step S15: second determining step).

In the second determining step (Step S15), in a case where the predetermined change occurs in the other one of the substrate luminance value and the guard luminance value (Step S15: YES), the time point at which the predetermined change occurs in the other one of the substrate luminance value and the guard luminance value, that is, the time point at which the predetermined change occurs in the substrate luminance value or the time point at which the predetermined change occurs in the guard luminance value, whichever is later, is detected as the processing end time point FT (Step S14: detecting step). The controller 3 is an example of the detecting unit. After the detecting step (Step S14), the controller 3 ends the end time point detection processing.

In the second determining step (Step S15), in a case where the predetermined change does not occur in the other one of the substrate luminance value and the guard luminance value (Step S15: NO), the controller 3 monitors whether or not the backup time elapses after the time point at which the predetermined change occurs (Step S16: backup time monitoring step).

In the backup time monitoring step (Step S16), in a case where the backup time does not elapse (Step S16: NO), the controller 3 returns to the second determining step (Step S15). In the backup time monitoring step (Step S16), in a case where the backup time elapses (Step S16: YES), the time point at which the predetermined change occurs in any one of the substrate luminance value and the guard luminance value is detected as the processing end time point FT (Step S14: detecting step). In such a way, in a case where the predetermined change occurs in any one of the substrate luminance value and the guard luminance value before the monitoring time of the luminance value reaches the supply end time point, irrespective of whether or not the predetermined change occurs in the other one of the substrate luminance value and the guard luminance value, the processing end time point FT is detected. After the detecting step (Step S14), the controller 3 ends the end time point detection processing.

In the fourth example of the end time point detection processing, the time point at which, after the predetermined change occurs in one of the substrate luminance value and the guard luminance value, the predetermined change occurs in the other one of the substrate luminance value and the guard luminance value, or the time point at which the predetermined backup time elapses after the time point at which the predetermined change occurs in one of the substrate luminance value and the guard luminance value, whichever is earlier, is detected as the processing end time point FT. Therefore, it is possible to promptly detect the time point at which the resist film is sufficiently removed from the upper surface of the substrate W and the residue of the resist film adhering to the inner wall surface 30a of the first guard 30A is sufficiently removed.

In the fourth example of the end time point detection processing, further, in a case where the controller 3 does not detect the processing end time point before the supply end time point is passed, the supply end time point is extended (supply end time point extending step).

The processing end time point FT is not always constant, but there is an individual difference for each substrate W. By extending the supply end time point in a case where the processing end time point is not detected before the supply end time point is passed, even in a case where the processing end time point FT is later than expected, it is possible to properly process the substrate W.

In the fourth example of the end time point detection processing, in a case where the supply end time point has been already extended once, and in a case where the processing end time point FT is not detected before the extended supply end time point is passed, the controller 3 makes the notifying unit 105 make notification to that effect.

Therefore, it is possible to promptly notify that the processing end time point FT is not detected due to the detection abnormality. By stopping the substrate processing in accordance with notification, it is possible to suppress the consumption of the processing liquid at the time of the detection abnormality. In addition, by calculating the notification time based on the processing end time point FT of the processed substrate W stored in the storage portion 3C, it is possible to optimize the notification time.

Other Preferred Embodiment

The invention is not limited to the preferred embodiment described above but can further be implemented in other modes.

For example, in the preferred embodiment described above, the discharge destination of the remover liquid is switched to any of the first drain piping 34 and the recovery piping 36 by changing the disposition of the plurality of guards 30. However, the discharge destination may be switched by opening and closing the valves.

Specifically, in a state where the plurality of guards 30 are disposed in the second liquid receiving disposition and the drain valve 39 is opened, and when the remover liquid processing step (Step S2) is started and the monitoring time of the luminance value reaches the processing end time point, the drain valve 39 is closed and the recovery valve 38 is opened while maintaining the plurality of guards 30 in the second liquid receiving disposition. The discharge destination of the remover liquid is thereby switched from the second drain piping 37 to the recovery piping 36 (flow passage switching step). In this case, the recovery valve 38 and the drain valve 39 function as a flow passage switching unit that switches the discharge destination of the liquid flowing through the common piping 35 between the recovery piping 36 and the second drain piping 37.

In the preferred embodiment described above, by the heater unit 12 facing the lower surface of the substrate W, the remover liquid on the upper surface of the substrate W is heated. The heating applied to the remover liquid is not limited to the heating by the heater unit 12. The heating applied to the remover liquid may be performed by, for example, supplying a heat medium such as heated nitrogen to the lower surface of the substrate W. In addition, the heating applied to the remover liquid may be performed by a lamp heater facing the upper surface of the substrate W. In a case of adopting the arrangement in which the remover liquid is heated by using the lamp heater facing the upper surface of the substrate W, it is possible to adopt an arrangement in which the substrate W is horizontally held by a spin chuck that vacuum suctions the lower surface of the substrate W.

In the preferred embodiment described above, in a case where the predetermined change occurs in the luminance values of all the first regions 111A, the controller 3 determines that the predetermined change occurs in the luminance value of the image of the upper surface of the substrate W in the determining step (Step S13). Similarly, in a case where the predetermined change occurs in the luminance values of all the second regions 111B, the controller 3 determines that the predetermined change occurs in the luminance value of the inner wall surface 30a of the first guard 30A in the determining step (Step S13).

However, the controller 3 may determine that the predetermined change occurs in the luminance value of the image of the upper surface of the substrate W in the determining step (Step S13) in a case where the predetermined change occurs in the luminance values of half or more of the plurality of first regions 111A. Similarly, the controller 3 may determine that the predetermined change occurs in the luminance value of the image of the inner wall surface 30a of the first guard 30A in the determining step (Step S13) in a case where the predetermined change occurs in the luminance values of half or more of the plurality of second regions 111B.

In the preferred embodiment described above, the detected regions 111 include the plurality of first regions 111A and the plurality of second regions 111B. Unlike the preferred embodiment described above, at least one first region 111A and at least one second region 111B may be provided.

In addition, the plurality of first regions 111A described above are aligned at intervals in the circumferential direction of the upper surface of the substrate W. However, the first regions 111A may be aligned at intervals in the radial direction of the upper surface of the substrate W, or may be aligned at intervals in the circumferential direction and in the radial direction of the upper surface of the substrate W.

In addition, the plurality of second regions 111B described above are aligned at intervals in the circumferential direction of the inner wall surface 30a of the first guard 30A. However, the second regions 111B may be aligned at intervals in the up and down direction, or may be aligned at intervals in the circumferential direction of the inner wall surface 30a of the first guard 30A and in the up and down direction.

In addition, while the remover liquid is ejected from the remover liquid nozzle 50, the remover liquid nozzle 50 may be horizontally moved so that a liquid landing position of the remover liquid with respect to the upper surface of the substrate W is scanned within the surface of the substrate W. In that case, it may require time to remove the resist film in an outer peripheral region between the central region of the upper surface of the substrate W and the peripheral edge region of the upper surface of the substrate W. Therefore, the first regions 111A are preferably aligned along the circumferential direction of the upper surface of the substrate W in the outer peripheral region between the central region of the upper surface of the substrate W and the peripheral edge region of the upper surface of the substrate W.

The remover liquid may be arranged to be supplied to the lower surface of the substrate W. The lower surface of the substrate W may be the surface to be processed.

The guard 30 with which the luminance value is to be detected is not limited to the innermost guard 30 (first guard 30A) but may be the second-innermost guard 30 (second guard 30B) or the outermost guard 30 (third guard 30C).

The position of the heater unit 12 may be changed from the proximity position to the separating position when a predetermined time elapses after the processing end time point FT. Similarly, the discharge destination of the remover liquid may be changed when a predetermined time elapses after the processing end time point FT.

In the preferred embodiment described above, after the removal processing step (Step S2), the rinsing step (Step S3) is executed. However, after the removal processing step (Step S2), and then after an ozone water supplying step of supplying ozone water to the upper surface of the substrate W is executed, the rinsing step may be executed.

In the preferred embodiment described above, the remover liquid that removes the resist film is used as the processing liquid. However, the processing liquid is not limited to the remover liquid described above but the invention of the present application can also be applied to processing other than the resist removal processing. For example, it is also possible to apply to processing such as metal etching processing.

In addition, in the preferred embodiment described above, the substrate processing apparatus 1 includes the transfer robots IR, CR, the plurality of processing units 2, and the controller 3. However, a substrate processing apparatus 1, 1P may be constituted of a single processing unit 2 and a controller 3, and does not have to include transfer robots IR, CR. Alternatively, the substrate processing apparatus 1 may be constituted of a single processing unit 2 only. In other words, the processing unit 2 may be an example of a substrate processing apparatus.

Although the expressions such as "along," "horizontal," "orthogonal," and "vertical" are used in the preferred embodiments described above, it is not necessary to be strictly "along," "horizontal," "orthogonal," and "vertical." That is, each of these expressions allows for deviations in manufacturing accuracy, installment accuracy, etc. Although the preferred embodiments of the present invention have been described in detail, these are merely specific examples used to clarify the technical content of the present invention, and the present invention should not be interpreted as being limited to these specific examples. The scope of the present invention shall be limited only by the appended claims.

The present application corresponds to Japanese Patent Application No. 2020-197918 filed with the Japan Patent Office on Nov. 30, 2020, the entire disclosure of which is incorporated herein by reference.

REFERENCE SIGNS LIST

1: substrate processing apparatus
2: processing unit (substrate processing apparatus)
3: controller (detecting unit, supply end time point extending unit)
11: remover liquid supplying unit
12: heater unit (heating unit)
13: rinse liquid supplying unit
20: substrate holding unit
21: substrate rotating unit
30: guard
30a: inner wall surface
30A: first guard
33: guard raising/lowering unit (flow passage switching unit)

34: first drain piping (drain flow passage)
36: recovery piping (recovery flow passage)
37: second drain piping (drain flow passage)
38: recovery valve (flow passage switching unit)
39: drain valve (flow passage switching unit)
56: sulfuric acid aqueous solution valve (liquid switching unit)
71: hydrogen peroxide solution valve (liquid switching unit)
82: rinse liquid valve (liquid switching unit)
100: image acquiring unit
110: image
A1: rotation axis
FT: processing end time point
LV: luminance value
W: substrate

The invention claimed is:

1. A substrate processing method comprising:
a substrate holding step of holding a substrate at a holding position surrounded by a cylindrical guard;
a processing liquid supplying step of supplying a surface of the substrate to be processed with a processing liquid that process the surface of the substrate to be processed while rotating the substrate held at the holding position about a rotation axis passing through a central portion of the substrate;
an image acquiring step of acquiring an image of the surface of the substrate to be processed and an image of an inner wall surface of the guard while supplying the processing liquid to the surface of the substrate to be processed; and
a determining step of monitoring luminance value of the images obtained in the image acquiring step and determining whether or not a predetermined change occurs in the luminance value of the image of the surface of the substrate to be processed and the luminance value of the image of the inner wall surface of the guard, wherein
in a case where the predetermined change does not occur in the luminance values of the images obtained in the image acquiring step before a predetermined notification time elapses after a start time point of monitoring of the luminance values, a notifying step of notifying that the predetermined change does not occur in the luminance values of the images obtained in the image acquiring step is executed, and
in a case where the predetermined change occurs in the luminance values of the images obtained in the image acquiring step before the notification time elapses after the start time point, a detecting step of detecting a processing end time point at which processing of the surface of the substrate to be processed with the processing liquid is ended is executed.

2. The substrate processing method according to claim 1, wherein the substrate processing method continuously processes a plurality of substrates and the notification time is a time calculated based on the processing end time point of the processed substrates.

3. A substrate processing method comprising:
a substrate holding step of holding a substrate at a holding position surrounded by a cylindrical guard;
a processing liquid supplying step of supplying a surface of the substrate to be processed with a processing liquid that process the surface of the substrate to be processed while rotating the substrate held at the holding position about a rotation axis passing through a central portion of the substrate;
an image acquiring step of acquiring an image of the surface of the substrate to be processed and an image of an inner wall surface of the guard while supplying the processing liquid to the surface of the substrate to be processed; and
a detecting step of monitoring luminance values of the images obtained in the image acquiring step, and detecting a processing end time point at which processing of the surface of the substrate to be processed with the processing liquid is ended based on the luminance value of the image of the surface of the substrate to be processed and the luminance value of the image of the inner wall surface of the guard.

4. The substrate processing method according to claim 3, further comprising a determining step of determining whether or not a predetermined change occurs in luminance values of the images obtained in the image acquiring step, wherein
in a case where the determining step has determined that the predetermined change does not occur in the luminance values of the images obtained in the image acquiring step before a supply end time point at which supply of the processing liquid to the surface of the substrate to be processed is scheduled to end, a supply end time point extending step of extending the supply end time point is executed, and
in a case where the determining step has determined that the predetermined change occurs in the luminance values of the images obtained in the image acquiring step before the supply end time point, the detecting step detects a time point at which the predetermined change occurs as the processing end time point.

5. The substrate processing method according to claim 3, wherein the detecting step includes a step of detecting, as the processing end time point, a time point at which a predetermined change occurs in any one of the luminance value of the image of the surface of the substrate to be processed obtained in the image acquiring step and the luminance value of the image of the inner wall surface of the guard obtained in the image acquiring step.

6. The substrate processing method according to claim 3, wherein the detecting step includes a step of detecting, as the processing end time point, a time point at which, after a predetermined change occurs in one of the luminance value of the image of the surface of the substrate to be processed obtained in the image acquiring step and the luminance value of the image of the inner wall surface of the guard obtained in the image acquiring step, the predetermined change occurs in the other one of the luminance value of the image of the surface of the substrate to be processed in the image acquiring step and the luminance value of the image of the inner wall surface of the guard obtained in the image acquiring step, or a time point at which a predetermined backup time elapses after the time point at which the predetermined change occurs in one of the luminance value of the image of the surface of the substrate to be processed obtained in the image acquiring step and the luminance value of the image of the inner wall surface of the guard obtained in the image acquiring step, whichever is earlier.

7. The substrate processing method according to claim 3, further comprising:
a heating step of heating the processing liquid on the surface of the substrate to be processed;
a heating weakening step of weakening heating applied to the processing liquid on the surface of the substrate to be processed while maintaining supply of the processing liquid to the surface of the substrate to be processed in a case where the processing end time point is detected; and a rinse liquid supplying step of stopping the supply of the processing liquid to the surface of the substrate to be processed after the heating weakening step, and supplying to the surface of the substrate to be processed a rinse liquid that washes away the processing liquid on the surface of the substrate to be processed.

8. The substrate processing method according to claim 3, further comprising:
    a draining step of discharging the processing liquid scattered from the substrate to a drain flow passage; and
    a flow passage switching step of switching a discharge destination of the processing liquid scattered from the substrate from the drain flow passage to a recovery flow passage in a case where the processing end time point is detected.

9. A substrate processing apparatus comprising:
    a substrate holding unit that holds a substrate at a predetermined holding position;
    a substrate rotating unit that rotates the substrate held by the substrate holding unit;
    a processing liquid supplying unit that supplies a surface of the substrate to be processed held by the substrate holding unit with a processing liquid that process the surface of the substrate to be processed;
    a cylindrical guard that surrounds the substrate held by the substrate holding unit and receives the processing liquid scattered from the substrate;
    an image acquiring unit that acquires an image of the surface of the substrate to be processed held by the substrate holding unit and an image of an inner wall surface of the guard; and
    a detecting unit that monitors luminance values of the images acquired by the image acquiring unit and detects a processing end time point at which processing of the surface of the substrate to be processed with the processing liquid is ended based on the luminance value of the image of the surface of the substrate to be processed and the luminance value of the image of the inner wall surface of the guard.

10. The substrate processing apparatus according to claim 9, wherein the detecting unit detects, as the processing end time point, a time point at which a predetermined change occurs in any one of the luminance value of the image of the surface of the substrate to be processed acquired by the image acquiring unit and the luminance value of the image of the inner wall surface of the guard acquired by the image acquiring unit.

11. The substrate processing apparatus according to claim 9, wherein the detecting unit detects, as the processing end time point, a time point at which, after a predetermined change occurs in one of the luminance value of the image of the surface of the substrate to be processed acquired by the image acquiring unit and the luminance value of the image of the inner wall surface of the guard acquired by the image acquiring unit, the predetermined change occurs in the other one of the luminance value of the image of the surface of the substrate to be processed acquired by the image acquiring unit and the luminance value of the image of the inner wall surface of the guard acquired by the image acquiring unit, or a time point at which a predetermined backup time elapses after the time point at which the predetermined change occurs in one of the luminance value of the image of the surface of the substrate to be processed acquired by the image acquiring unit and the luminance value of the image of the inner wall surface of the guard acquired by the image acquiring unit, whichever is earlier.

12. The substrate processing apparatus according to claim 9, further comprising:
    a heating unit that heats the processing liquid on the surface of the substrate to be processed held by the substrate holding unit, and weakens heating applied to the substrate at the processing end time point;
    a rinse liquid supplying unit that supplies to the surface of the substrate to be processed held by the substrate holding unit a rinse liquid that washes away the processing liquid; and
    a liquid switching unit that switches a liquid to be supplied to the surface of the substrate to be processed held by the substrate holding unit from the processing liquid to the rinse liquid after the processing end time point.

13. The substrate processing apparatus according to claim 9, further comprising:
    a drain flow passage through which the processing liquid received by the guard is drained;
    a recovery flow passage through which the processing liquid scattered from the substrate held by the substrate holding unit is recovered; and
    a flow passage switching unit that switches a discharge destination of the processing liquid scattered from the substrate from the drain flow passage to the recovery flow passage at the processing end time point.

14. The substrate processing apparatus according to claim 9, further comprising:
    a supply end time point extending unit that extends a supply end time point at which supply of the processing liquid to the surface of the substrate to be processed held by the substrate holding unit is scheduled to end in a case where the detecting unit does not detect the processing end time point before the supply end time point is passed.

15. The substrate processing apparatus according to claim 9, further comprising:
    a notifying unit that notifies that the processing end time point is not detected in a case where the detecting unit does not detect the processing end time point before a predetermined notification time elapses after a start time point of monitoring of the luminance values.

16. The substrate processing apparatus according to claim 15, wherein the substrate processing apparatus continuously processes a plurality of substrates, and the notification time is a time calculated based on the processing end time point of the processed substrates.

* * * * *